(12) United States Patent
Shimizu et al.

(10) Patent No.: US 11,112,494 B2
(45) Date of Patent: Sep. 7, 2021

(54) PHOTODETECTOR AND PORTABLE ELECTRONIC EQUIPMENT

(71) Applicant: SHARP KABUSHIKI KAISHA, Sakai (JP)

(72) Inventors: Takayuki Shimizu, Sakai (JP); Takuma Hiramatsu, Sakai (JP); Yoshiki Ikuta, Sakai (JP); Hideki Sato, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 118 days.

(21) Appl. No.: 16/613,985

(22) PCT Filed: Mar. 29, 2018

(86) PCT No.: PCT/JP2018/013283
§ 371 (c)(1),
(2) Date: Nov. 15, 2019

(87) PCT Pub. No.: WO2018/211831
PCT Pub. Date: Nov. 22, 2018

(65) Prior Publication Data
US 2021/0141069 A1 May 13, 2021

(30) Foreign Application Priority Data
May 18, 2017 (JP) .............................. JP2017-098993

(51) Int. Cl.
*G01S 7/497* (2006.01)
*G01S 17/10* (2020.01)

(52) U.S. Cl.
CPC .............. *G01S 7/497* (2013.01); *G01S 17/10* (2013.01)

(58) Field of Classification Search
CPC .................................. G01S 7/497; G01S 17/10
See application file for complete search history.

(56) References Cited

U.S. PATENT DOCUMENTS

| 10,261,175 | B2* | 4/2019 | Halliday | ................ H01S 5/0262 |
| 2020/0256993 | A1* | 8/2020 | Oggier | ..................... G01S 17/89 |

FOREIGN PATENT DOCUMENTS

| JP | 2016-145776 A | 8/2016 |
| JP | 2016-176750 A | 10/2016 |

\* cited by examiner

*Primary Examiner* — Seung C Sohn
(74) *Attorney, Agent, or Firm* — ScienBiziP, P.C.

(57) ABSTRACT

Effects of ambient light are suppressed, and distance to a detection object is measured with high precision. A ranging sensor includes a VCSEL, a SPAD array that has multiple SPADs that detect photons of pulse light emitted by the VCSEL, a SPAD array that has multiple SPADs that detect photons of reflected light where the pulse light has been reflected by a detection object, a DLL that measures a time difference between a pulse signal output from the SPADs of the SPAD array and a pulse signal output from the SPADs of the SPAD array, an ambient-light-incident SPAD determining unit that determines a SPAD on which ambient light is incident, based on pulse signals output from SPADs of the SPAD array when the VCSEL is not emitting light, and a SPAD front-end circuit that stops operation of the SPAD for which determination is made that ambient light is incident.

9 Claims, 26 Drawing Sheets

1: VCSEL
3: SPAD ARRAY (RFERENCE SIDE)
4: SPAD ARRAY (RETURN SIDE)
21: CASE
21a: OPENING
21b: OPENING
22: OPTICAL FILTER (LIGHT EMITTING SIDE)
23: OPTICAL FILTER (LIGHT RECEIVING SIDE)
24: CONCENTRATING LENS
25: LIGHT-SHIELDING PARTITION
100: RANGING SENSOR

WHEN THERE IS NO LIGHT EMISSION BY LIGHT-EMITTING ELEMENT

| | |
|---|---|
| 1A: VCSEL | 21b: OPENING |
| 1B: VCSEL | 21c: OPENING |
| 1C: VCSEL | 23: OPTICAL FILTER (LIGHT RECEIVING SIDE) |
| 1D: VCSEL | 24: CONCENTRATING LENS |
| 1E: VCSEL | 25: LIGHT SHIELDING PARTITION |
| 3: SPAD ARRAY (REFERENCE SIDE) | 26: DIFFUSION LENS |
| 4: SPAD ARRAY (RETURN SIDE) | 100A: RANGING SENSOR |
| 21: CASE | |

301: SPAD ARRAY (REFERENCE SIDE)   304: VCSEL
302: SPAD ARRAY (RETURN SIDE)       305: OPTICAL FILTER
303: LIGHT SHIELDING PARTITION      306: OPTICAL FILTER

PHOTODETECTOR AND PORTABLE ELECTRONIC EQUIPMENT

TECHNICAL FIELD

The present invention relates to a photodetector that optically measures the distance to a detection object.

BACKGROUND ART

Portable information terminals such as smartphones have come into widespread use in recent years. Various types of sensors have come to be installed in portable information terminals such as mentioned above, due to reduction in size of cameras, proximity sensors, orientation sensors, acceleration sensors, angular velocity sensors, illuminance sensors, and so forth. Conventionally, a method of performing autofocusing (AF) of a camera using contrast of images has generally been performed for autofocusing of cameras built in to smartphones. However, contrast AF has a weakness in that in a case where contrast of objects to be photographed is low, such as in dark places or the like, AF speed drops drastically, and lens focusing becomes sluggish. Accordingly, there is desire for a ranging sensor that is small and capable of high-speed operation, and capable of high-speed AF even in dark places. Accordingly, in recent years, TOF (Time of Flight)-type ranging sensors for AF are beginning to be installed in cellular phones under such demands.

There also is demand for small and lightweight ranging sensors for robotic usages such as drones and so forth. TOF-type ranging sensors, which are advantageous regarding reduction in size compared with ranging sensors that use triangulation-type PSD light-receiving elements, are useful to this end.

A SPAD (Single-Photon Avalanche Diode: single-photon avalanche amplification photodiode), which is an avalanche photodiode that operates in Geiger mode can detect single photons. This single-photon detection is realized by biasing a SPAD at a voltage higher than a breakdown voltage, as indicated by point A in FIG. 26. When a photon arrives and avalanche amplification occurs, the SPAD transitions to a metastable state (point B in FIG. 26). This avalanche amplification is quenched (point C in FIG. 26) by quenching resistance connected to the SPAD, and the bias voltage is lowered below the breakdown voltage. Thereafter, the bias voltage is restored, transition is made to a standby state in Geiger mode, and the state of point A illustrated in FIG. 26 is maintained until the next photon is incident on the SPAD. SPADs operate in Geiger mode in this way, so sensitivity to light is extremely high, with photon detection efficiency reaching several % to several tens of %, although this varies depending on wavelength.

Multiple SPADs can be laid out in an array to further raise photon detection efficiency. In a case of using high-sensitivity SPADs in a TOF-type ranging sensor in this way, there is a problem of being readily affected by ambient light such as sunlight, light from artificial lighting, and so forth.

FIG. 27 is a sectional view illustrating the structure of a conventional TOF-type ranging sensor. A SPAD array 301 on the reference side and a SPAD array 302 on the return side are separated from each other by a light-shielding partition 303 in the ranging sensor. Only light emitted by a VCSEL (Vertical Cavity Surface Emitting LASER: vertical cavity surface emitting laser) 304 is incident on the SPAD array 301 on the reference side. On the other hand, the SPAD array 302 on the return side is configured such that only reflected light from a defection object is incident on the SPAD array 302 on the return side via an optical filter 305.

An optical filter 306 functions as a bandpass filter to pass light of wavelengths near the emission wavelength of the VCSEL 304. Accordingly, the optical filter 306 has a structure where erroneous reaction of SPADs due to ambient light does not readily occur.

FIG. 28 is a spectrum diagram of sunlight (AM1.5). There is an absorption band due to water vapor around 940 nm as illustrated in FIG. 28, and light of a wavelength around 940 nm is often used to minimize the effects of sunlight outdoors.

It is conceivable to use an optical filter having a transmission spectrum of an optical bandpass filter as illustrated in FIG. 29, and a light-emitting element having a light emission spectrum such as illustrated in FIG. 30. Thus, a structure can be made where ambient light components other than near 940 nm in wavelength are not incident on the SPAD array 301 on the reference side and the SPAD array 302 on the return side. As a result, the S/N ratio can be raised.

CITATION LIST

Patent Literature

CITATION LIST

Patent Literature

PTL 1: Japanese Unexamined Patent Application Publication "Japanese Unexamined Patent Application Publication No. 2016-176750 (Published Oct. 6, 2016)"

PTL 2: Japanese Unexamined Patent Application Publication "Japanese Unexamined Patent Application Publication No. 2016-145776 (Published Aug. 12, 2016)"

SUMMARY OF INVENTION

Technical Problem

However, ambient light cannot be completely eliminated from the transmission band of the optical bandpass filter, and the light-emission spectrum of the VCSEL 304 has only a band of several nm, as illustrated in FIG. 30. Narrowing the bandwidth of the optical bandpass filter to handle this is conceivable. However, the light-emission spectrum of the VCSEL 304 is subject to temperature drift, so there is a need to secure a bandwidth of several tens of nm for the optical bandpass filter. Also, in a case of usage under incandescent lighting including a great amount of light that is 940 nm in wavelength or outdoors in sunny conditions, there is a problem that the SPADs react to ambient light even if the band is narrowed, and the S/N drops.

Also, PTL 1 discloses a technique to improve ambient light tolerance by using a TOF-type ranging sensor. Specifically, PTL 1 discloses an example of realizing both high sensitivity and ambient light tolerance by narrowing the light emission angle on the light emitting side and the light reception angle on the light receiving side by scanning operations using a polygonal mirror. However, this sort of example has a problem in that the size of the sensor is large and costs are high.

Also, PTL 2 discloses control of a SPAD array as measures against afterpulsing of SPADs. However, PTL 2 does not disclose a clear technique to serve as measures against ambient light.

It is an object of an aspect of the present invention to suppress effects of ambient light and measure distance to a detection object with high precision.

Solution to Problem

In order to solve the above problem, a photodetector according to an aspect of the present invention includes a light-emitting element, a first light-receiving unit that has a plurality of avalanche photodiodes as a first light-receiving element that detects, in Geiger mode, photons of pulse light emitted by the light-emitting element, a second light-receiving unit that has a plurality of avalanche photodiodes as a second light-receiving element that detects, in Geiger mode, photons of reflected light where the pulse light has been reflected by a detection object, a time difference measuring unit that measures a time difference between a pulse signal output from the first light-receiving element of the first light-receiving unit and a pulse signal output from the second light-receiving element of the second light-receiving unit, an ambient-light-incident light-receiving-element determining unit that determines the second light-receiving element on which ambient light is incident, based on pulse signals output from second light-receiving elements of the second light-receiving unit when the light-emitting element is not emitting light, and an operation stopping unit that stops operation of the second light-receiving elements for which determination is made that ambient light is incident.

Advantageous Effects of Invention

According to an aspect of the present invention, advantages are obtained in that effects of ambient light are suppressed, and distance to a detection object can be measured with high precision.

DESCRIPTION OF EMBODIMENTS

Embodiment 1

Figure 1:
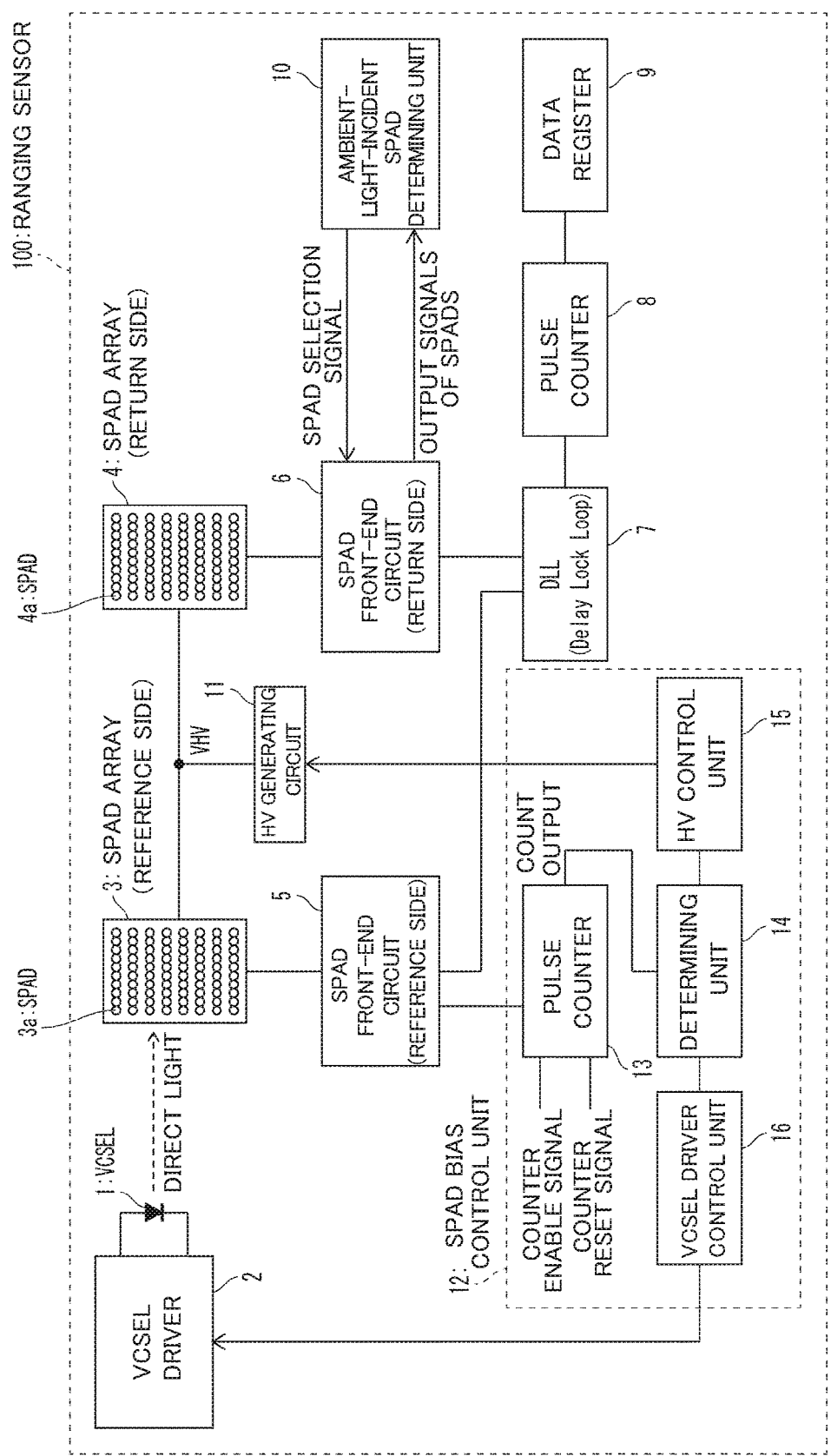
FIG. 1 is a block diagram illustrating the configuration of a ranging sensor according to Embodiments 1 to 4 of the present invention.
Figure 2:
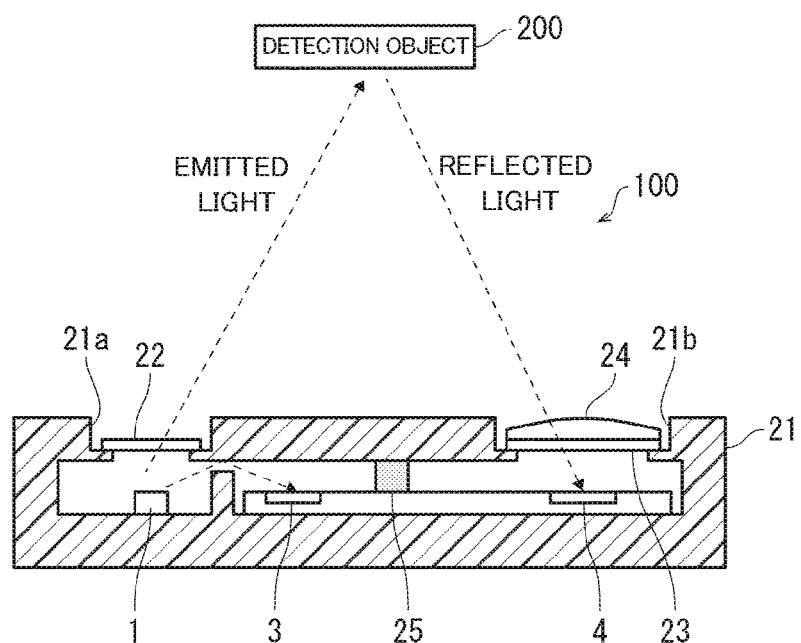
FIG. 2 is a longitudinal-sectional view illustrating the structure of the ranging sensor.

Embodiment 1 of the present invention will be described below with reference to FIG. 1 through FIG. 11.
<Configuration of Ranging Sensor 100>
FIG. 1 is a block diagram illustrating the configuration of a ranging sensor 100 according to the present embodiment. FIG. 2 is a longitudinal-sectional view of the structure of the ranging sensor 100.

The ranging sensor 100 (photodetector) is a TOF (Time of Flight)-type ranging sensor, as illustrated in FIG. 1. This ranging sensor 100 has a VCSEL 1, a VCSEL driver 2, SPAD arrays 3 and 4, SPAD front-end circuits 5 and 6, a DLL (Delay Lock Loop) 7, a pulse counter 8, a data register 9, an ambient-light-incident SPAD determining unit 10 (ambient-light-incident light-receiving-element determining unit), an HV generating circuit 11, and a SPAD bias control unit 12.

The VCSEL (Vertical Cavity Surface Emitting LASER: vertical cavity surface emitting laser) 1 is a laser light source that outputs optical pulses. The VCSEL 1 is preferable as a light-emitting element, since the light emission wavelength band is narrow, and there is little temperature variation of the light emission peak wavelength. The VCSEL driver 2 is a drive circuit that drives the VCSEL 1.

The SPAD array 3 (first light-receiving unit) is provided on the reference side and directly receives optical pulses from the VCSEL 1. The SPAD array 3 has multiple SPADs (Single-Photon-Avalanche Diodes: single-photon avalanche amplification photodiodes) 3a (first light-receiving elements). The SPADs 3a are avalanche photodiodes that detect photons of incident light in Geiger mode, and output pulse signals including one pulse for each photon detected. The SPADs 3a are laid out in a matrix form in the SPAD array 3.

The SPAD array 4 (second light-receiving unit) is provided on the return side and receives optical pulses where optical pulses of the VCSEL 1 have been reflected by a detection object 200, as illustrated in FIG. 2. The SPAD array 4 also has multiple (same number as the SPADs 3a) SPADs 4a (second light-receiving elements) laid out in a matrix form in the same way as the SPAD array 3.

The SPAD front-end circuit 5 is a circuit that performs waveform shaping of the pulse signals from the SPADs 3a of the SPAD array 3 and outputs shaped pulse signals corresponding to the pulse signals. The SPAD front-end circuit 6 (operation stopping unit) is a circuit that performs waveform shaping of the pulse signals from the SPADs 4a of the SPAD array 4 and outputs shaped pulse signals corresponding to the pulse signals. The SPAD front-end circuit 6 also stops the operation of SPADs 4a where the ambient light incidence level is high in accordance with SPAD selection signals from the ambient-light-incident SPAD determining unit 10 which will be described later.

The DLL 7 (time difference measuring unit) detects, from the shaped pulse signals of the SPAD front-end circuit 5 and the shaped pulse signals of the SPAD front-end circuit 6, an average value of time difference between pulse light received by the SPADs 3a of the SPAD array 3 and pulse light received by the SPADs 4a of the SPAD array 4. This time difference is the delay time of the pulses received by the SPADs 4a of the SPAD array 4 relative to the pulse light received by the SPADs 3a and corresponds to the time of flight of light over the distance to the detection object 200.

The pulse counter 8 is a counter that calculates the distance to the detection object 200 by measuring the average value of time difference output from the DLL 7. The data register 9 is a storage circuit that stores measurement values of the pulse counter 8.

The ambient-light-incident SPAD determining unit 10 determines the SPADs 4a that are reacting to incident ambient light by monitoring puke signals from the SPADs 4a of the SPAD array 4 when the VCSEL 1 is not emitting light from the SPAD front-end circuit 6. The ambient-light-incident SPAD determining unit 10 provides the SPAD front-end circuit 6 with SPAD selection signals for stopping operation of SPADs 4a where the ambient light incidence level is high.

The HV generating circuit 11 is a circuit that generates a reverse bias voltage VHV (high voltage) to be applied to the SPAD arrays 3 and 4.

The SPAD bias control unit 12 adjusts the output voltage of the HV generating circuit 11 and controls the VCSEL driver 2 in accordance with whether or not there are pulse signals output from the SPAD array 3 on the reference side. Accordingly, the SPAD bias control unit 12 has a pulse counter 13, a determining unit 14, an HV control unit 15, and a VCSEL driver control unit 16.

The pulse counter 13 counts the number of pulses of pulse signals output from the SPAD array 3 when setting the reverse bias voltage to be applied to the SPAD arrays 3 and 4. The determining unit 14 determines whether or not the count value of the number of pulses output by the pulse counter 13 is smaller than the number of light emission pulses of the VCSEL 1.

The HV control unit 15 controls the HV generating circuit 11 based on the determination results from the determining unit 14. The VCSEL driver control unit 16 controls the VCSEL driver 2 based on the determination results from the determining unit 14. The SPAD array 3 can be made to operate in an optimal Geiger mode by control of the HV control unit 15 and VCSEL driver control unit 16.

The ranging sensor 100 further has a case 21, optical filters 22 and 23, a concentrating lens 24, and a light-shielding partition 25, as illustrated in FIG. 2.

The VCSEL 1 and SPAD arrays 3 and 4 are disposed within the case 21. The optical filter 22 is disposed at a position in an opening 21a of the case 21 where light emitted from the VCSEL 1 is transmitted. Only direct light from the VCSEL 1 is incident on the SPAD array 3 on the reference side, and only reflected light from the detection object 200 is incident on the SPAD array 4 on the return side.

The light-shielding partition 25 is disposed between the SPAD arrays 3 and 4 and blocks direct light from the VCSEL such that the direct light from the VCSEL is not incident on the SPAD array 4. The optical filter 23 is disposed at a position in an opening 21b of the case 21 where reflected light from the detection object 200 is transmitted. The optical filter 23 functions as a bandpass filter to transmit light of wavelengths near the light emission wavelength of the VCSEL 1. The concentrating lens 24 is disposed above the optical filter 23 on the side thereof on which light is incident, and functions to change the imaging position on the SPAD array 4 corresponding to the position of the detection object 200.

Figure 3:
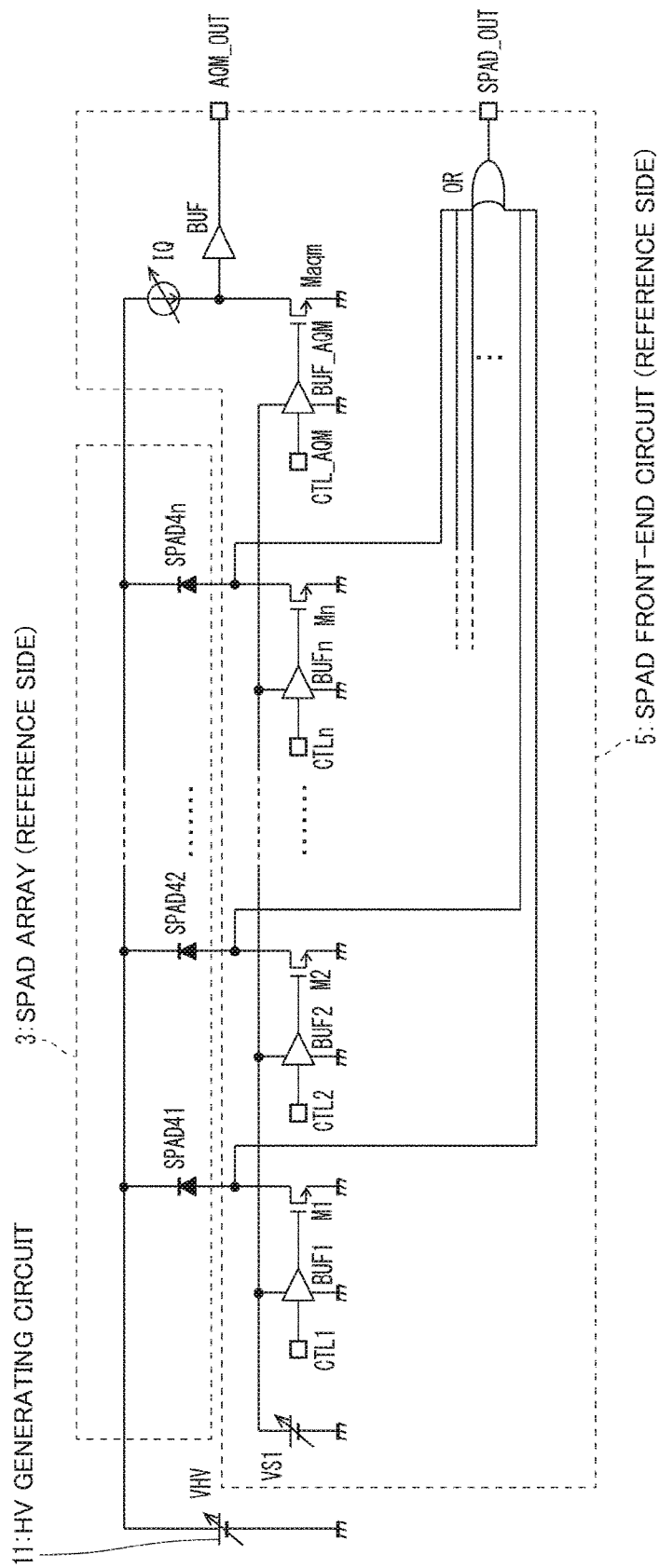
FIG. 3 is a circuit diagram illustrating the configuration of a SPAD array and a SPAD front-end circuit, both on the reference side, of the ranging sensor.

Next, the SPAD array 3 and the SPAD front-end circuit 5, both on the reference side, will be described. FIG. 3 is a circuit diagram illustrating the configuration of the SPAD array 3 and SPAD front-end circuit 5 in the ranging sensor 100.

The SPAD array 3 includes n number of SPADs 41 through 4n as SPADs 3a, as illustrated in FIG. 3. A high voltage VHV is applied to the cathodes of the SPADs 41 through 4n by the HV generating circuit 11.

The SPAD front-end circuit 5 has an active quenching circuit formed of NMOS transistors M1 through Mn that are of the same size, buffers BUF1 through BUFn, and an OR circuit OR. The buffers BUF1 through BUFn are provided to apply a gate voltage to the NMOS transistors M1 through Mn. The buffers BUF1 through BUFn respectively apply a power source voltage VS1 to the gates of the NMOS transistors M1 through Mn when control signals CTL1 through CTLn being input thereto shift to a high level.

The anodes of the SPAD 41 through SPAD 4n are respectively connected to the NMOS transistors M1 through Mn. Pulse current output from the SPAD 41 through SPAD 4n is converted into a pulse voltage by the aforementioned active quenching circuit. The OR circuit OR outputs the OR of the pulse voltage signals as detection signals SPAD_OUT.

Accordingly, in a case where a pulse signal is output from any one of the SPAD 41 through SPAD 4n, the detection signal SPAD_OUT is output. Using a great number of SPAD 41 through SPAD 4n enables sensitivity to be raised.

The SPAD front-end circuit 5 also has a current source IQ, an NMOS transistor Maqm making up an active quenching circuit, and a buffer BUF_AQM. The current source IQ is a circuit that can change the current value to any value. When a control signal CTL_AQM shifts to a high level, the buffer BUF_AQM applies the power source voltage VS1 to the gate of the NMOS transistor Maqm.

The SPAD front-end circuit 5 also has an output buffer BUF. The output buffer BUF outputs the potential level between the current source IQ and NMOS transistor Maqm as an active quenching detection signal AQM_OUT.

<Operations of Ranging Sensor 100>

Figure 4:
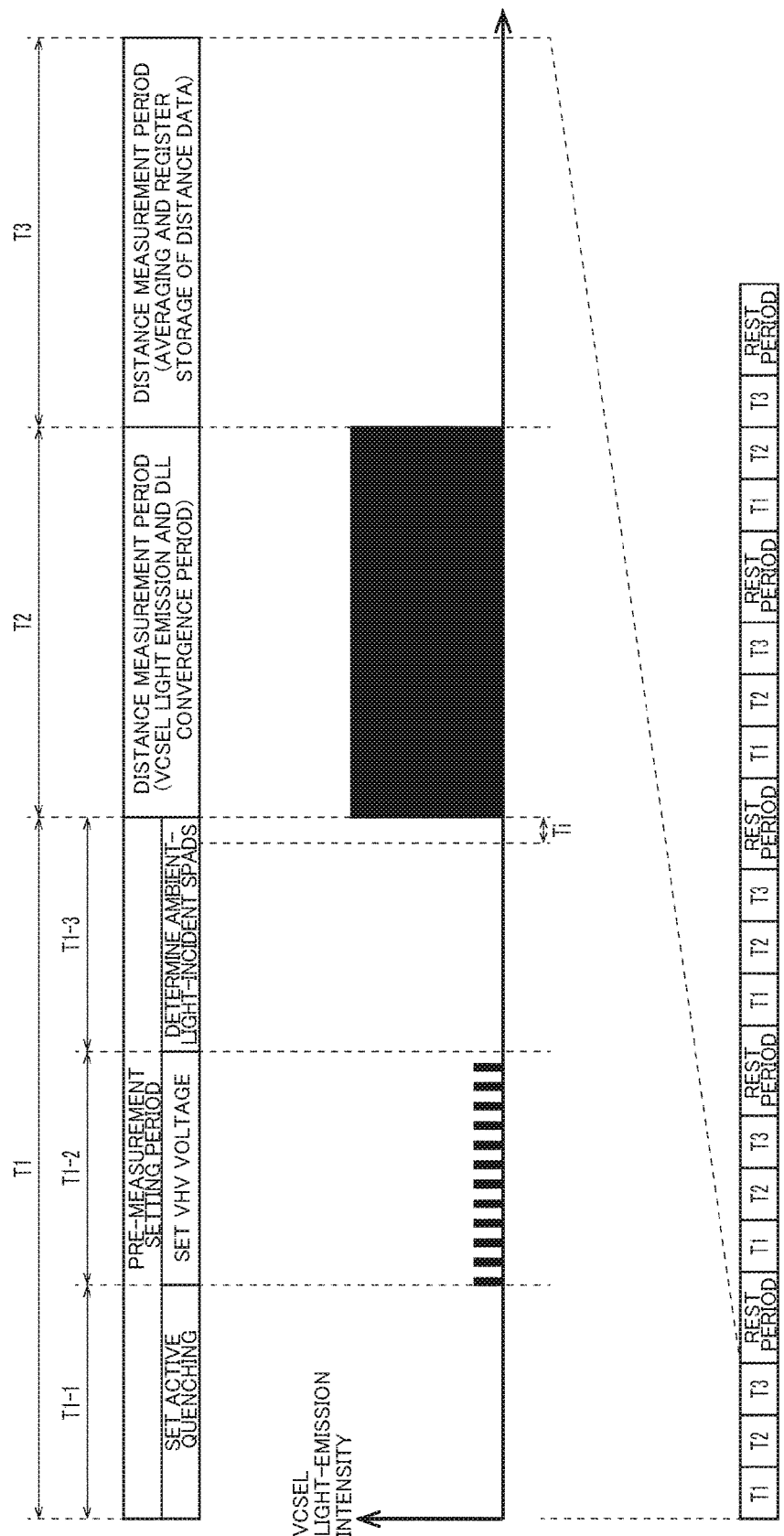
FIG. 4 is a sequence diagram illustrating operations of the ranging sensor.
Figure 5:
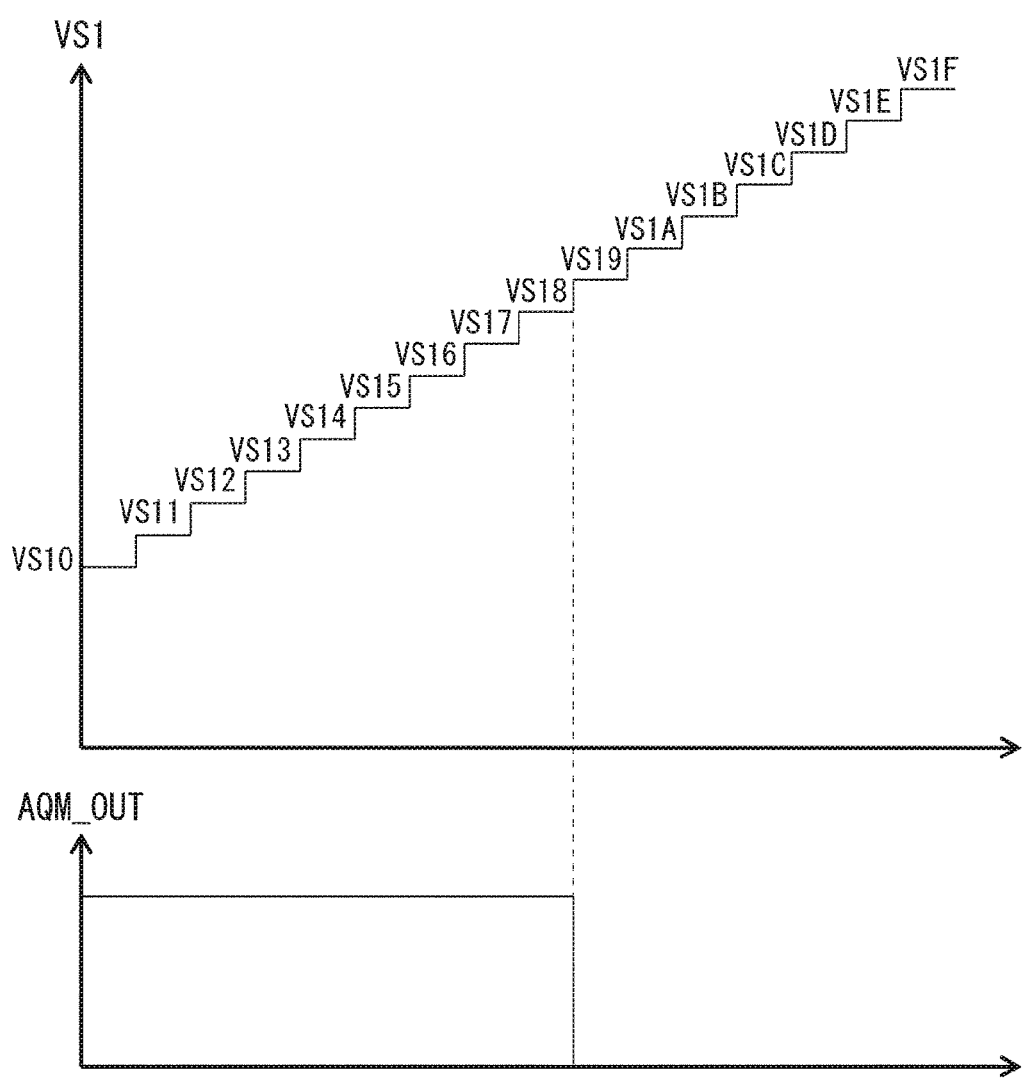
FIG. 5 is a sequence diagram illustrating operations of the ranging sensor setting active quenching resistance values.
Figure 6:
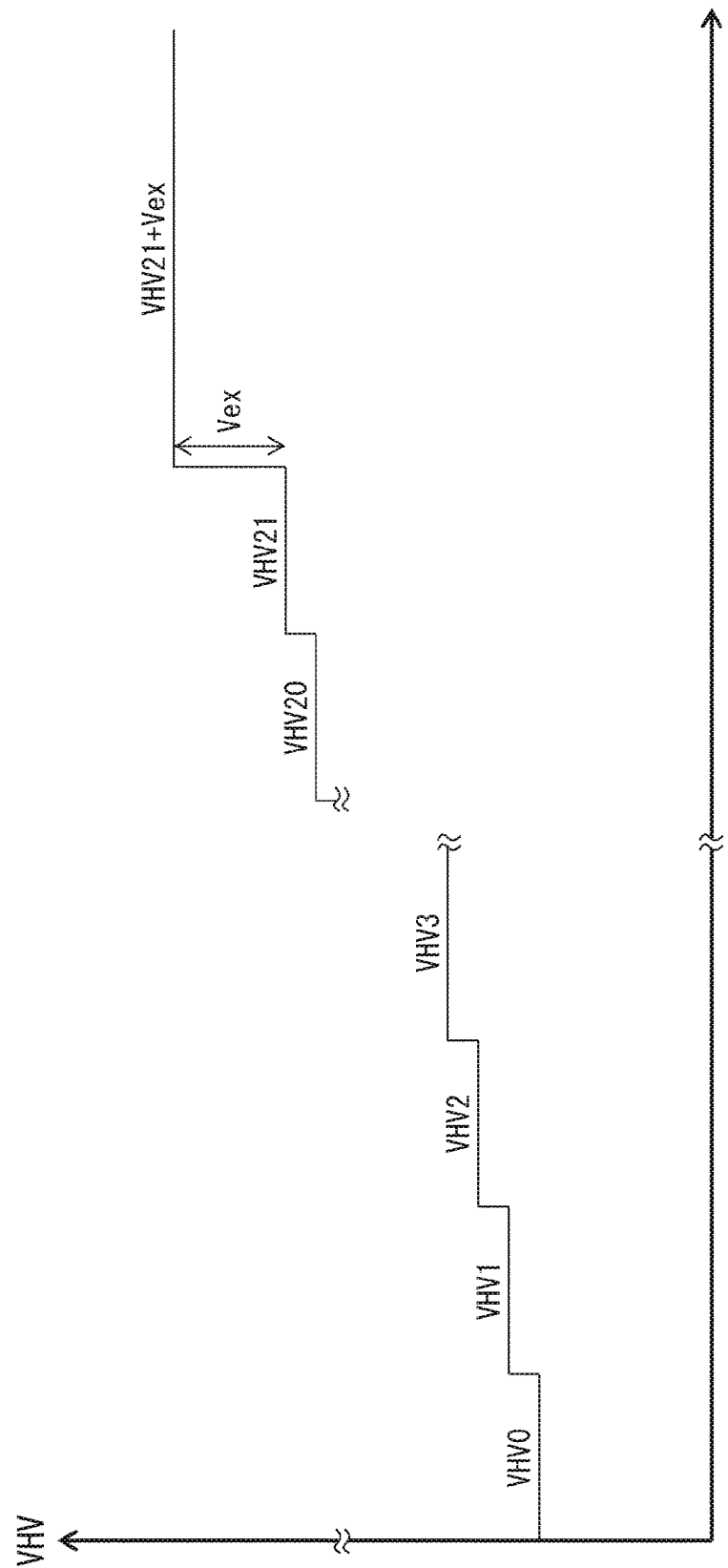
FIG. 6 is a sequence diagram illustrating operations of the ranging sensor setting a bias voltage of the SPAD array.
Figure 7:
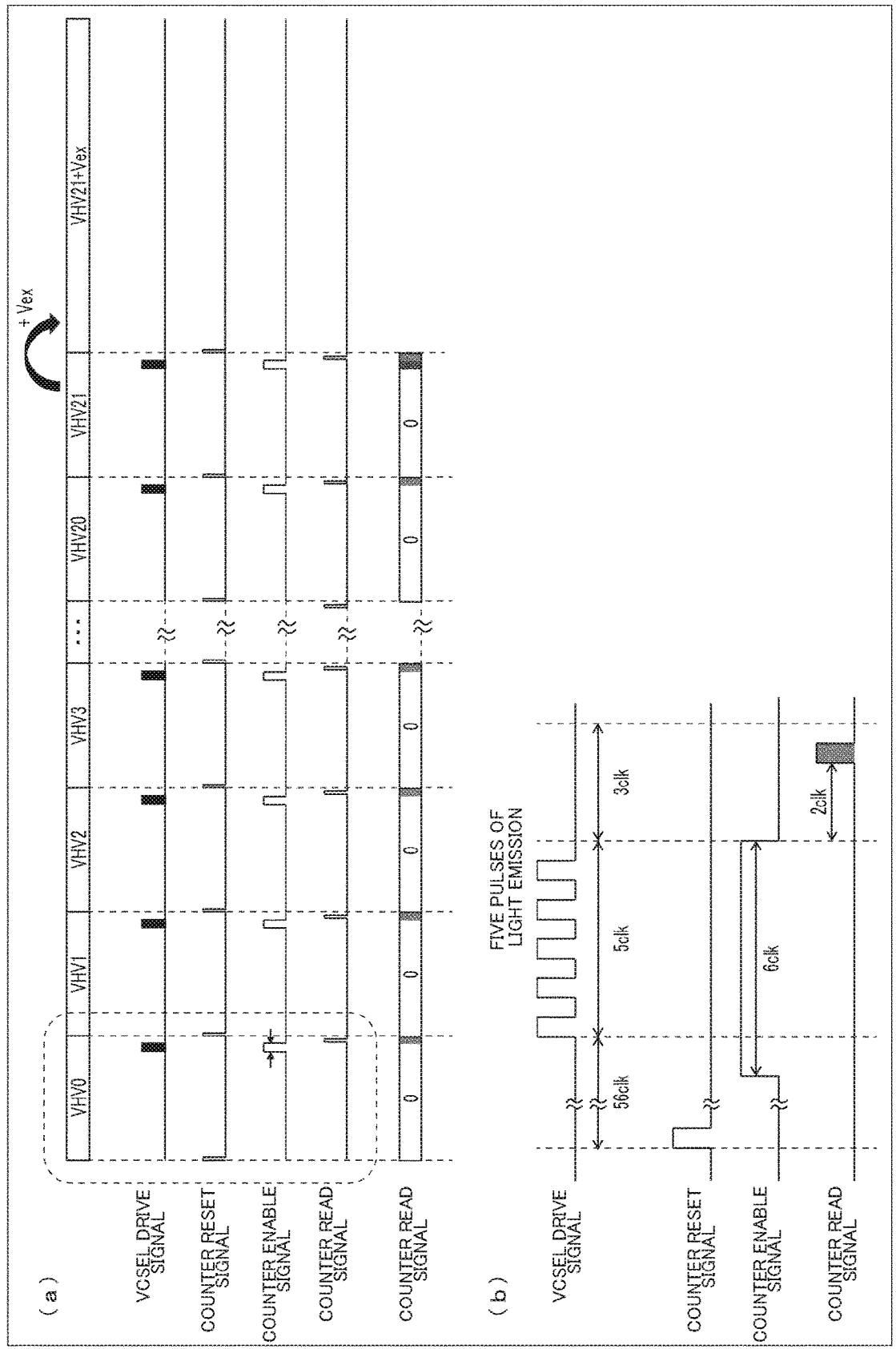
FIG. 7(a) is a timing chart illustrating operations of the ranging sensor setting a bias voltage of the SPAD array.
FIG. 7(b) is an enlarged view; of primary portions in the timing chart in FIG. 7(a).

The operations of the ranging sensor 100 will be described now. FIG. 4 is a sequence diagram illustrating operations of the ranging sensor 100. FIG. 5 is a sequence diagram illustrating operations of the ranging sensor 100 setting active quenching resistance values. FIG. 6 is a sequence diagram illustrating operations of the ranging sensor 100 setting the bias voltage of the SPAD array 3. FIG. 7(a) is a timing chart illustrating operations of the ranging sensor 100 setting the bias voltage of the SPAD array 3, and FIG. 7(b) is an enlarged view of primary portions in the timing chart of FIG. 7(a).

Operations of the ranging sensor 100 are generally divided into a pre-measurement setting period T1, a distance measurement period T2 VCSEL light emission and DLL convergence period), and a distance measurement period T3 (averaging and register storage of distance data), as illustrated in FIG. 4.

In the pre-measurement setting period T1, the SPAD front-end circuit 5 first sets active quenching resistance in an active quenching setting period T1-1. Thereafter, before distance measurement, the SPAD bias control unit 12 sets the reverse bias voltage VHV of the SPADs 3a and 4a in a VHV voltage setting period T1-2, thereby performing initial setting for the SPADs 3a and 4a to operate in an optimal Geiger mode. Further, the ambient-light-incident SPAD determining unit 10 determines whether there is incidence of ambient light in an ambient-light-incident SPAD determining period T1-3 and stops operation of these SPADs 4a.

In the distance measurement period T2, the SPAD bias control unit 12 causes pulse light emission of the VCSEL 1, and the DLL 7 performs convergence of delay time (amount of delay) of pulses received by the SPADs 4a of the SPAD array 4 relative to the pulse light received by the SPADs 3a. The pulse counter 8 then counts the amount of delay at the DLL 7 converged in the distance measurement period T2, thereby creating data regarding the distance to the detection object 200, which is stored in the data register 9.

After the above-described pre-measurement setting period T1, distance measurement period T2, and distance measurement period T3 have elapsed, the ranging sensor 100 transitions to a rest period of a predetermined amount of time, and performs processing in the pre-measurement setting period T1, distance measurement period T2, and distance measurement period T3 again, the flow being performed repeatedly.

In the active quenching setting period T1-1, the SPAD bias control unit 12 sets the current value of current flowing to the SPADs 41 through 4n by using the current source IQ, sets the control signal CTL_AQM to high level, and boosts the voltage value of the power source voltage VS1 in stages as illustrated in FIG. 5. Boosting the voltage value of the power source voltage VS1 boosts the gate voltage of the NMOS transistor Maqm, and ON resistance (active quenching resistance) changes (becomes smaller). The boost intervals of the power source voltage VS1 may be equidistant, but do not have to be equidistant. The SPAD bias control unit 12 employs the power source voltage VS1 when the active quenching signal AQM_OUT is reversed from high level to low level (VS19 in FIG. 5) as the active quenching control voltage.

In the VHV voltage setting period T1-2, the HV control unit 15 boosts the reverse vice bias voltage VHV from a low voltage (initial voltage VHV0) to a high voltage in stages, as illustrated in FIG. 6. Immediately after the HV generating circuit 11 applies the reverse bias voltage VHV0 to the SPAD array 3, the SPAD bias control unit 12 provides a counter reset signal to the pulse counter 13, as illustrated in FIGS. 7(a) and 7(b). Accordingly, the pulse counter 13 is reset to a 0 count.

Thereafter, the VCSEL driver control unit 16 provides the VCSEL driver 2 with VCSEL drive signals to cause the VCSEL 1 to perform pulse light emission five times. Although the number of pulses is five pulses here, another number of pulses may be used. The SPAD bias control unit 12 sets an enable signal of the pulse counter 13 to active (high level) during the period in which the VCSEL 1 is emitting light. Accordingly, the pulse counter 13 counts the pulses output from the SPAD array 3. Thereafter, the SPAD bias control unit 12 sets a counter read signal to a high level. Accordingly, the determining unit 14 reads in the count value of the pulse counter 13.

Now, in a case of having determined that the count value is smaller than the number of light emission pulses of the VCSEL 1, the determining unit 14 instructs the HV control unit 15 to use the HV generating circuit 11 to boost the reverse bias voltage VHV to voltage VHV1. The steps of boosting the reverse bias voltage VHV may be of equal voltage, but do not have to be of equal voltage. The determining unit 14 continues to boost the reverse bias voltage VHV, and if the count value of the pulse counter 13 is five or more upon the reverse bias voltage VHV reaching voltage VHV21 as one example, determines that voltage VHV21 is a breakdown voltage (VBD) of the SPADs.

The HV control unit 15 controls the HV generating circuit 11 to generate a voltage that is higher than the breakdown voltage by an amount equivalent to an over-voltage Vex in order to cause the SPADs to operate in Geiger mode. Thus, the HV generating circuit 11 changes the reverse bias voltage VHV to be applied to the SPAD array 3 to VHV21+Vex in the distance measurement period T2. The over-voltage Vex may be given temperature dependency here. Controlling the reverse bias voltage VHV applied to the SPAD array 3 each time before the distance measurement period T2 as described above enables the SPAD array 3 to operate in a stable manner in an optimal Geiger mode, even if breakdown of the SPADs varies due to temperature variance or process conditions.

Figure 8:
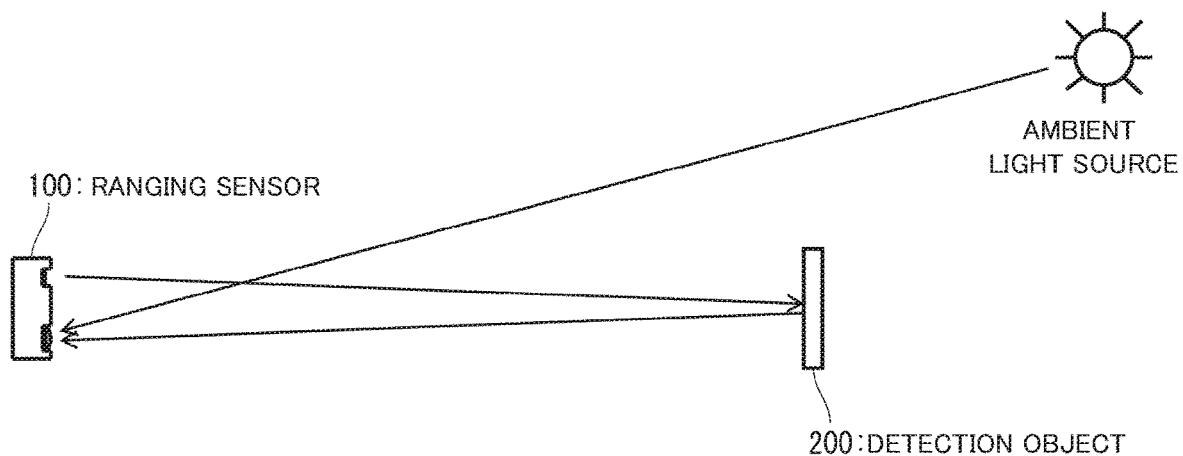
FIG. 8 is a diagram illustrating a positional relationship of the ranging sensor, detection object, and ambient light source.
Figure 9:
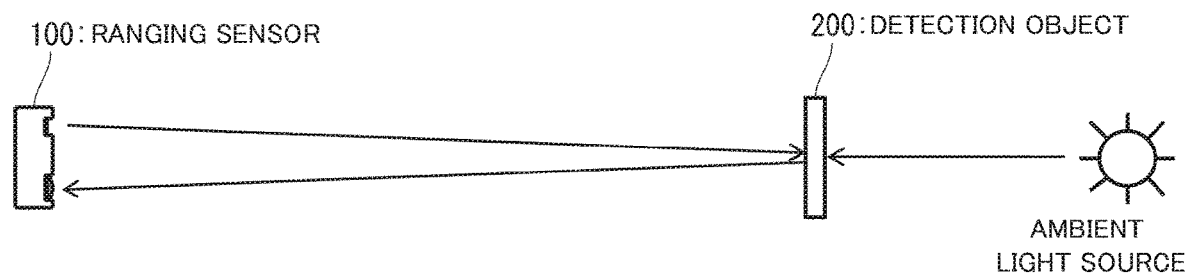
FIG. 9 is a diagram illustrating another positional relationship of the ranging sensor, detection object, and ambient light source.
Figure 10:
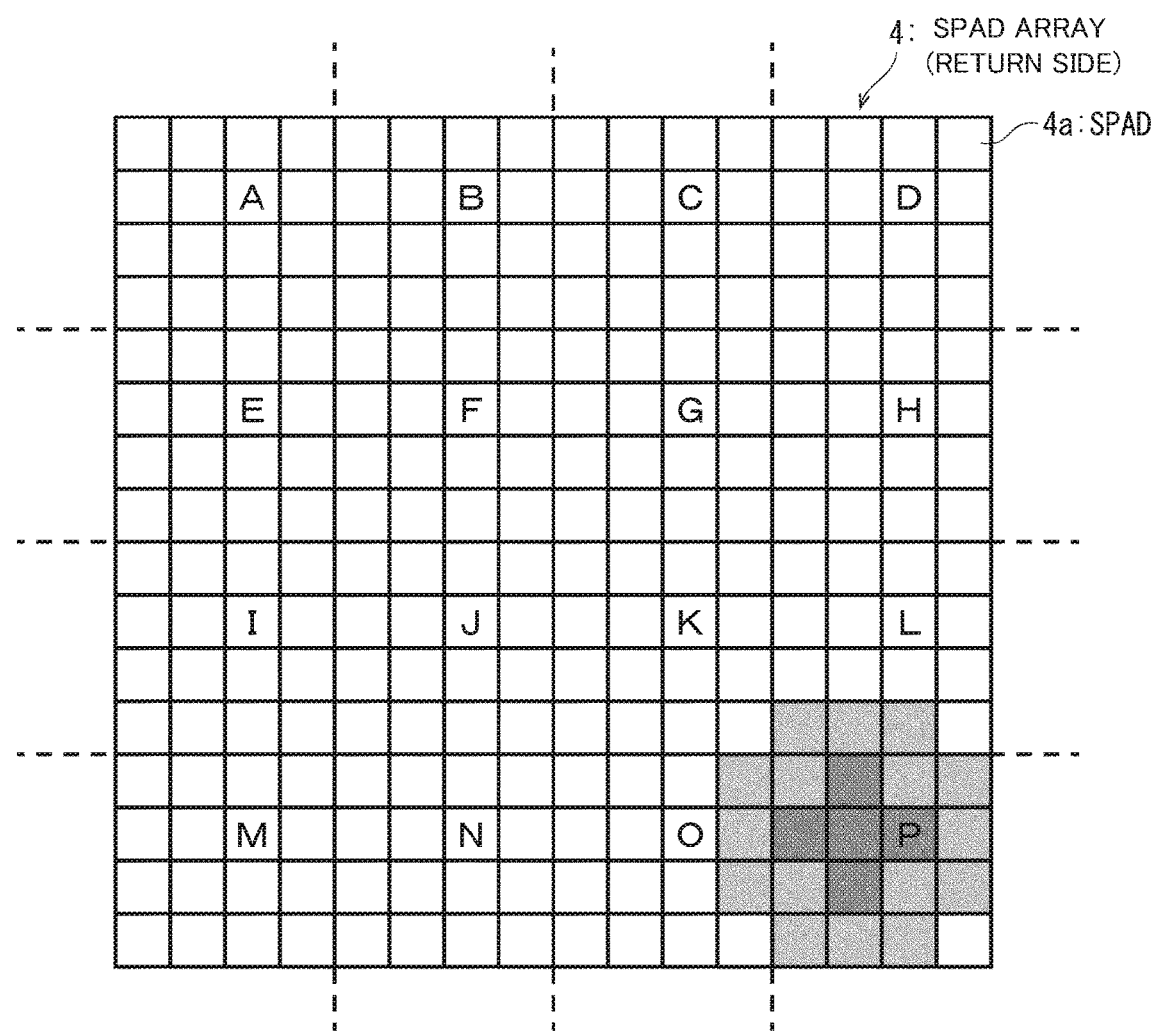
FIG. 10 is a diagram illustrating distribution of pulse count values of pulse signals output from the SPADs in the SPAD array when ambient light is incident.
Figure 11:
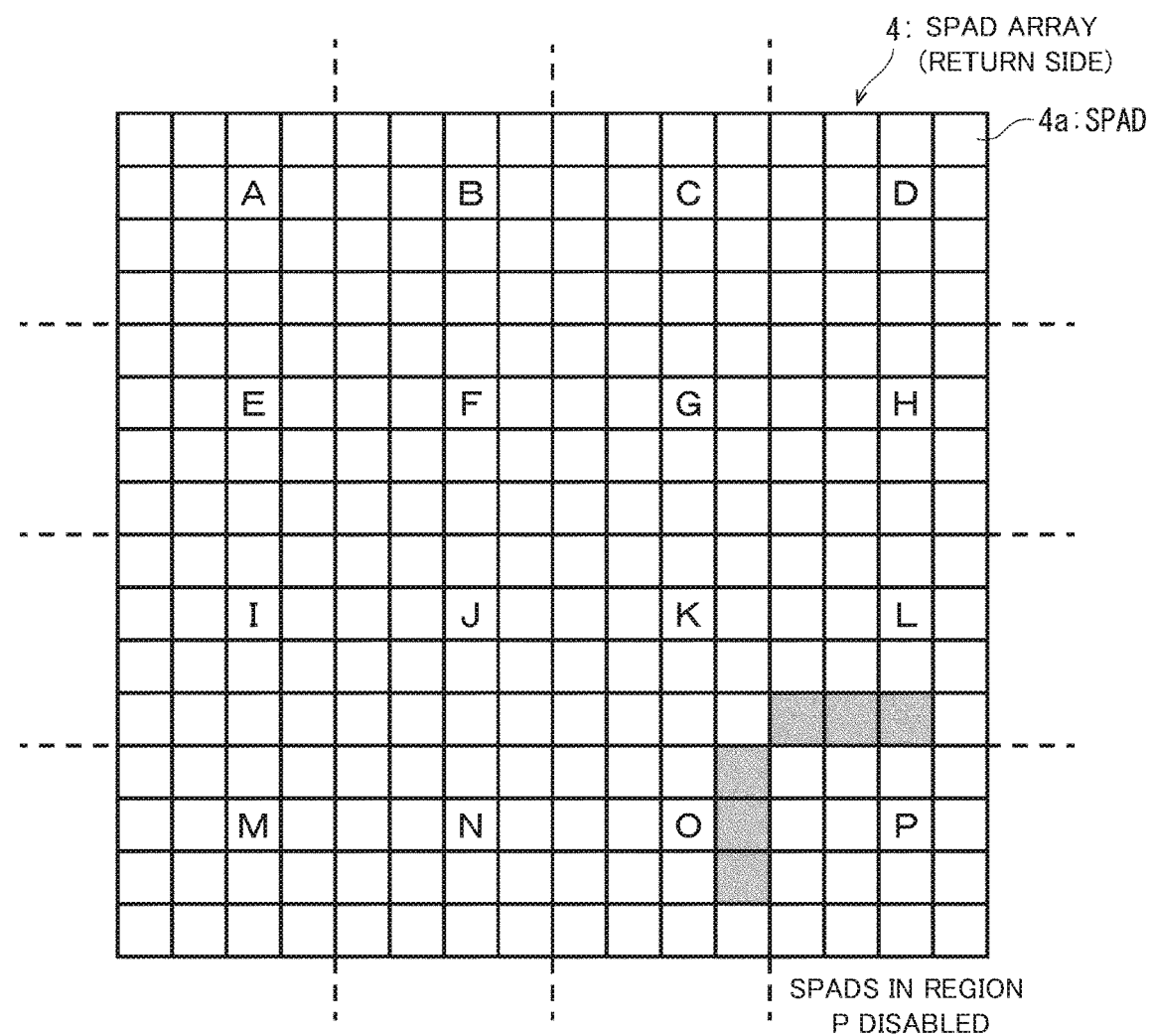
FIG. 11 is a diagram illustrating distribution of pulse count values of pulse signals output from the SPADs in a state where operation of the SPADs where ambient light is incident has been stopped.

Operations of the ranging sensor 100 in the ambient-light-incident SPAD determining period T1-3 will be described. FIG. 8 is a diagram illustrating a positional relationship of the ranging sensor 100, detection object 200, and ambient light source. FIG. 9 is a diagram illustrating another positional relationship of the ranging sensor 100, detection object 200, and ambient light source. FIG. 10 is a diagram illustrating distribution of pulse count values of pulse signals output from the SPADs 4a in the SPAD array 4 when ambient light is incident. FIG. 11 is a diagram illustrating distribution of pulse count values of pulse signals output from the SPADs 4a in a state where operation of the SPADs 4a where ambient light is incident has been stopped.

First, a case where the ranging sensor 100, detection object 200, and ambient light source are situated in the positional relationship illustrated in FIG. 8 will be described. In this positional relationship, the detection object 200 is situated in the front of the ranging sensor 100, and the ambient light source is irradiating the ranging sensor 100 with light from a backlighting position obliquely behind the detection object 200.

FIG. 10 illustrates an example of layouts of the SPADs 4a in the SPAD array 4. The SPAD array 4 has laid out therein, 16×16, for a total of 256, SPADs 4a. In a case of performing signal processing with 4×4 for a total of 16 SPADs 4a as one unit, the region of the SPAD array 4 is divided into 16 regions of A through P. Note that division is not restricted to this, and one SPAD 4a may be taken as one unit with the SPAD array 4 divided into 256 regions, for example.

In a case of the ranging sensor 100 being disposed as illustrated in FIG. 8, the ambient light source is imaged in a region centered on the region P of the SPAD array 4 as illustrated in FIG. 10, in a case where the light-emitting element (VCSEL 1) of the ranging sensor 100 is not emitting light. This imaging position changes depending on the position of the ambient light source.

Also, in a case where the ambient light source is behind the detection object 200 as viewed from the ranging sensor 100 as illustrated in FIG. 9, the ambient light source is obscured by the detection object so light from ambient light is not imaged on the SPAD array 4. Note however, that in a case where the spread of the ambient light source is larger than the detection object 200, ambient light is imaged in a doughnut-like form around the detection object 200.

In a case where the ambient light source is imaged in a region centered on region P as illustrated in FIG. 10, the number of pulses output from the SPADs 4a is proportionate to the amount of light by which the SPADs 4a are irradiated. Accordingly, the sum of the number of pulses is the greatest at the SPADs 4a in region P, out of regions A through P.

Generally, a TOF-type ranging sensor detects a delay difference from a point in time at which pulse light is emitted from a light-emitting element toward a detection object to a point in time at which it is reflected by the detection object and returns. Accordingly, generation of pulses at random times due to ambient light causes delay values at the DLL 7 that detects delay time to vary and time for the DLL 7 to converge delay values to be longer, resulting in lower ranging precision.

In a case where the number of output pulses of the SPADs 4a due to ambient light exceeds a value set beforehand, operation of the SPADs 4a in that region is stopped in the present embodiment, as illustrated in FIG. 11, in order to prevent such a drop in ranging precision. Thus, random pulse streams due to ambient light, output from the SPADs 4a due to ambient light, can be eliminated. Accordingly, ranging precision when ambient light is incident can be improved.

Although the time of flight of light is calculated by the DLL 7 in the present embodiment, this is not restrictive. For example, the time of flight of light may be calculated by a TDC (Time-to-Digital Converter) circuit.

Embodiment 2

Embodiment 2 of the present invention will be described below with reference to FIG. 12 and FIG. 13. Note that for the sake of convenience in description, components having the same functions as components described in Embodiment 1 are denoted by the same symbols, and description thereof will be omitted. A configuration at the SPAD front-end circuit 6 where operation of SPADs 4a where ambient light is incident is stopped will be described in the present embodiment.

Figure 12:
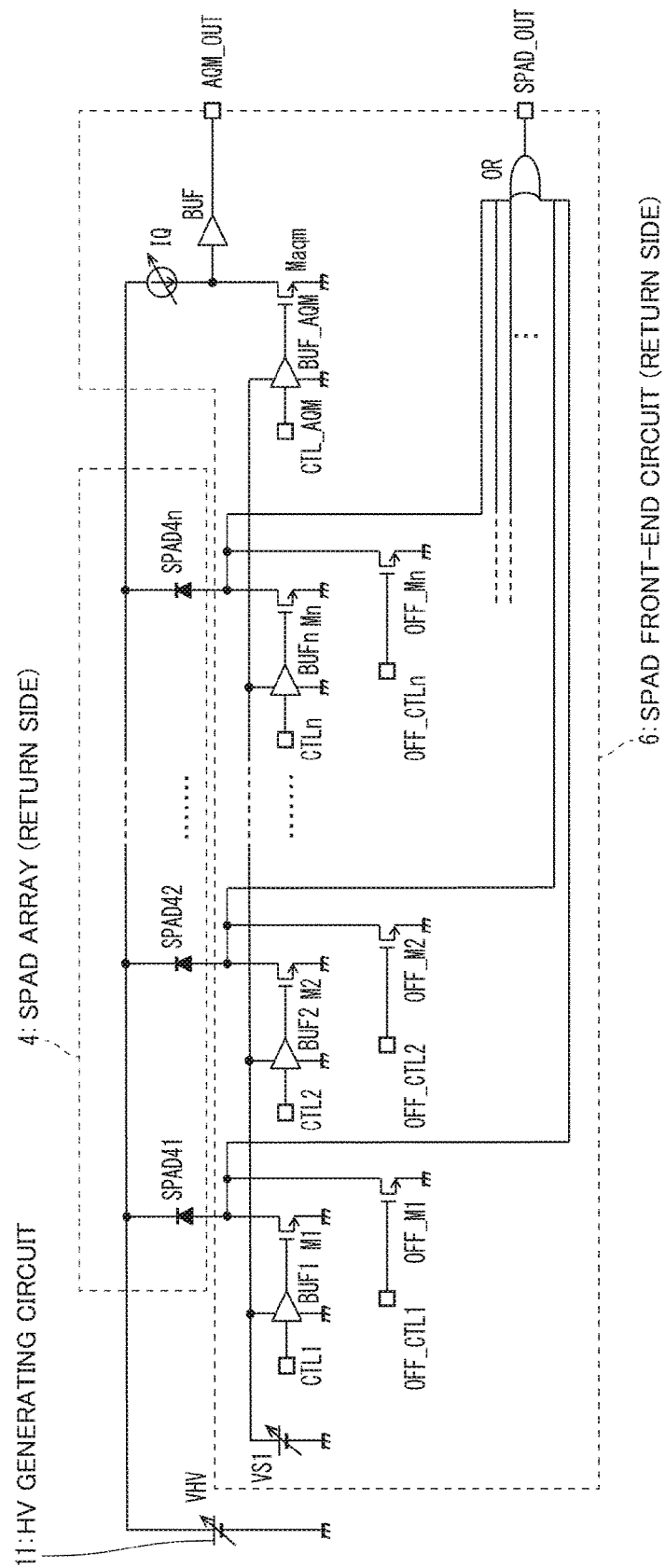
FIG. 12 is a circuit diagram illustrating the configuration of a SPAD array and a SPAD front-end circuit, both on the return side, according to Embodiment 2 of the present invention.

FIG. 12 is a circuit diagram illustrating the configuration of the SPAD array 4 and SPAD front-end circuit 6, both on the return side, according to the present embodiment. FIG. 13 is a circuit diagram illustrating another configuration of the SPAD array 4 and SPAD front-end circuit 6, both on the return side, according to the present embodiment.

The SPAD array 4 on the return side illustrated in FIG. 12 includes an n number of SPADs 41 through 4n as the SPADs 4a, in the same way as the SPAD array 3 on the reference side.

The SPAD front-end circuit 6 on the return side illustrated in FIG. 12 has an active quenching circuit configured of NMOS transistors M1 through Mn, buffers BUF1 through BUFn, and an OR circuit OR, the same as with the SPAD front-end circuit 5 at the reference side. The SPAD front-end circuit 6 also has a current source IQ, an NMOS transistor Maqm making up an active quenching circuit, a buffer BUF_AQM, and an output buffer BUF, the same as with the SPAD front-end circuit 5.

The SPAD front-end circuit 6 further has NMOS transistors OFF_M1 through OFF_Mn used to stop the operation of the SPADs. The NMOS transistors OFF_M1 through OFF_Mn are connected to the anodes of the SPADs 41 through 4n so as to be in parallel with the NMOS transistors M1 through Mn. Also, control signals OFF_CTL1 through OFF_CTLn for turning the NMOS transistors OFF_M1 through OFF_Mn to OFF are input to the respective gates of the NMOS transistors OFF_M1 through OFF_Mn. The control signals OFF_CTL1 through OFF_CTLn are provided from the ambient-light-incident SPAD determining unit 10 as the aforementioned SPAD selection signals.

Figure 13:
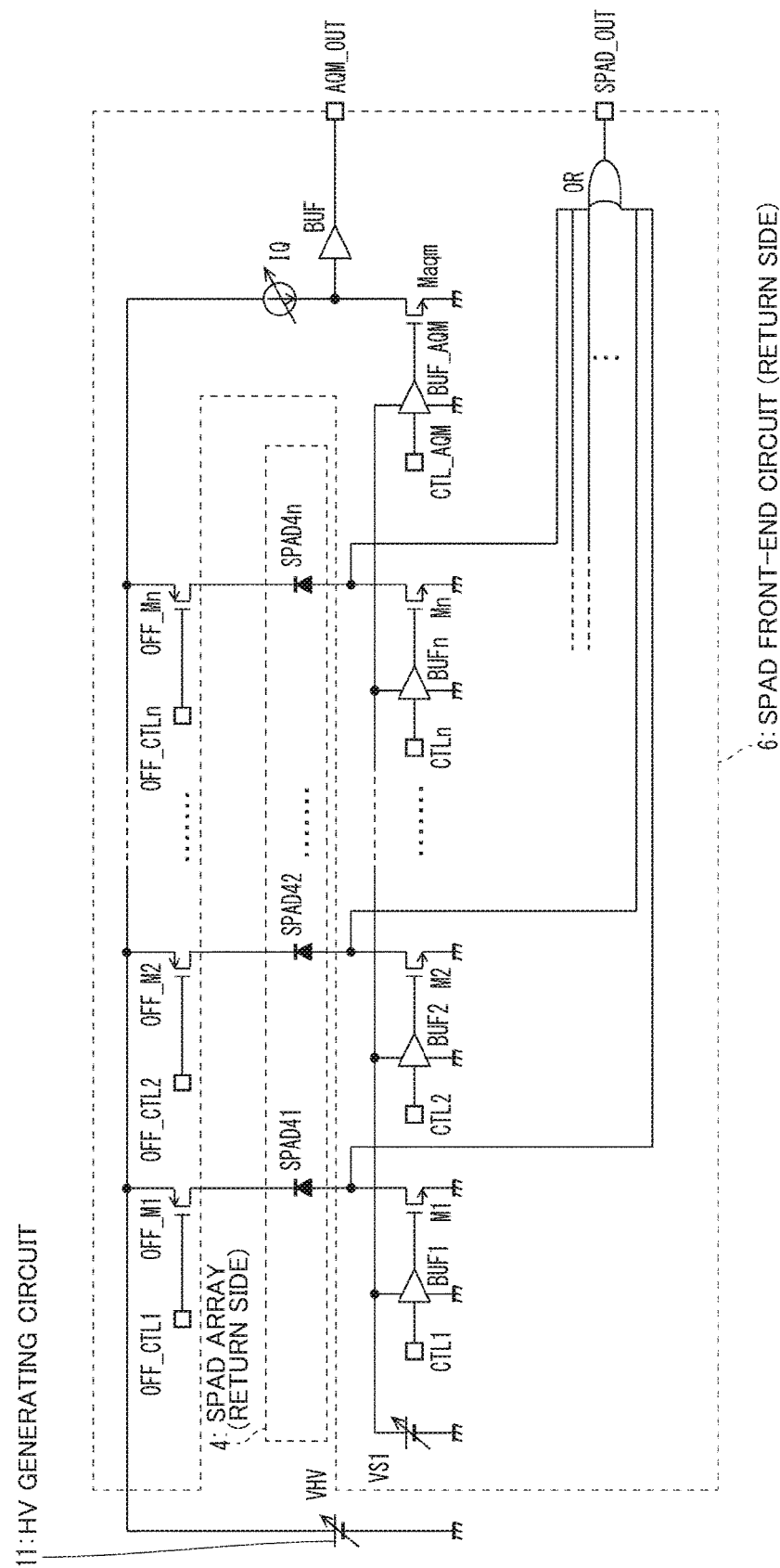
FIG. 13 is a circuit diagram illustrating another configuration of the SPAD array and SPAD front-end circuit, both on the return side, according to Embodiment 2 of the present invention.

The SPAD array 4 on the return side illustrated in FIG. 13 has the same configuration as the above SPAD array 4 illustrated in FIG. 12.

The SPAD front-end circuit 6 on the return side illustrated in FIG. 13 is of a configuration having the same circuit elements as the above SPAD front-end circuit 6 illustrated in FIG. 12. Note however, that in the SPAD front-end circuit 6 illustrated in FIG. 13, the NMOS transistors OFF_M1 through OFF_Mn are connected to the HV generating circuit 11 and the cathodes of the SPADs 41 through 4n.

When any of the control signals OFF_CTL1 through OFF_CTLn shift to the high level, the NMOS transistors OFF_M1 through OFF_Mn shift to OFF in a corresponding manner, in the SPAD front-end circuit 6 illustrated in FIG. 12 and FIG. 13 that has the configuration described above. Accordingly, an NMOS transistor OFF_M1 (where i is any integer) that has turned to OFF causes a SPAD10i of which the anode is connected to the ground to not operate (to be disabled).

In this way, the SPAD front-end circuit 6 can stop operation of the SPADs 41 through 4n, due to having the NMOS transistors OFF_M1 through OFF_Mn. Accordingly, a SPAD front-end circuit 6 that has operation stopping functions of the SPADs 41 through 4n can be configured with simplicity.

Embodiment 3

Embodiment 3 of the present invention will be described below with reference to FIG. 1 and FIG. 14 through FIG. 16. Note that for the sake of convenience in description, components having the same functions as components described in Embodiment 1 are denoted by the same symbols, and description thereof will be omitted.

Figure 14:
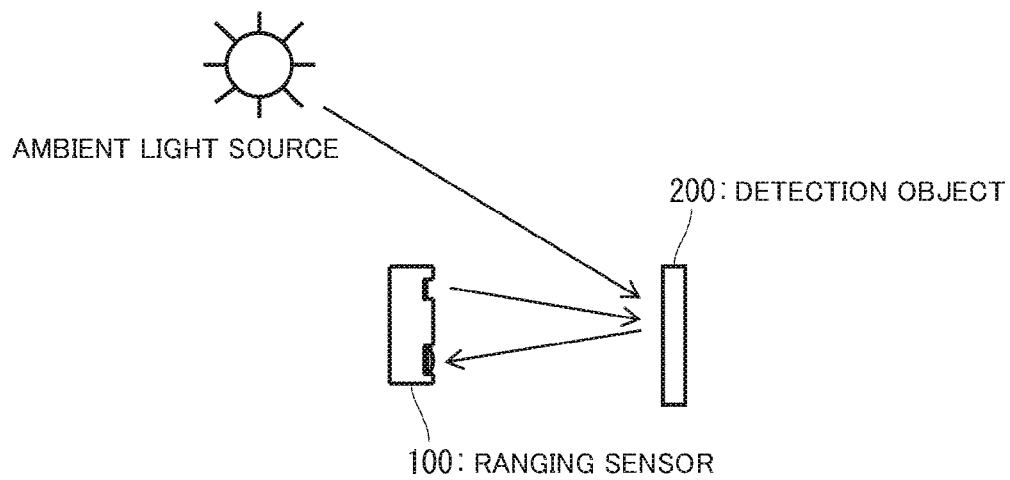
FIG. 14 is a diagram illustrating a positional relationship of a ranging sensor, detection object, and ambient light source, according to Embodiment 3.
Figure 15:
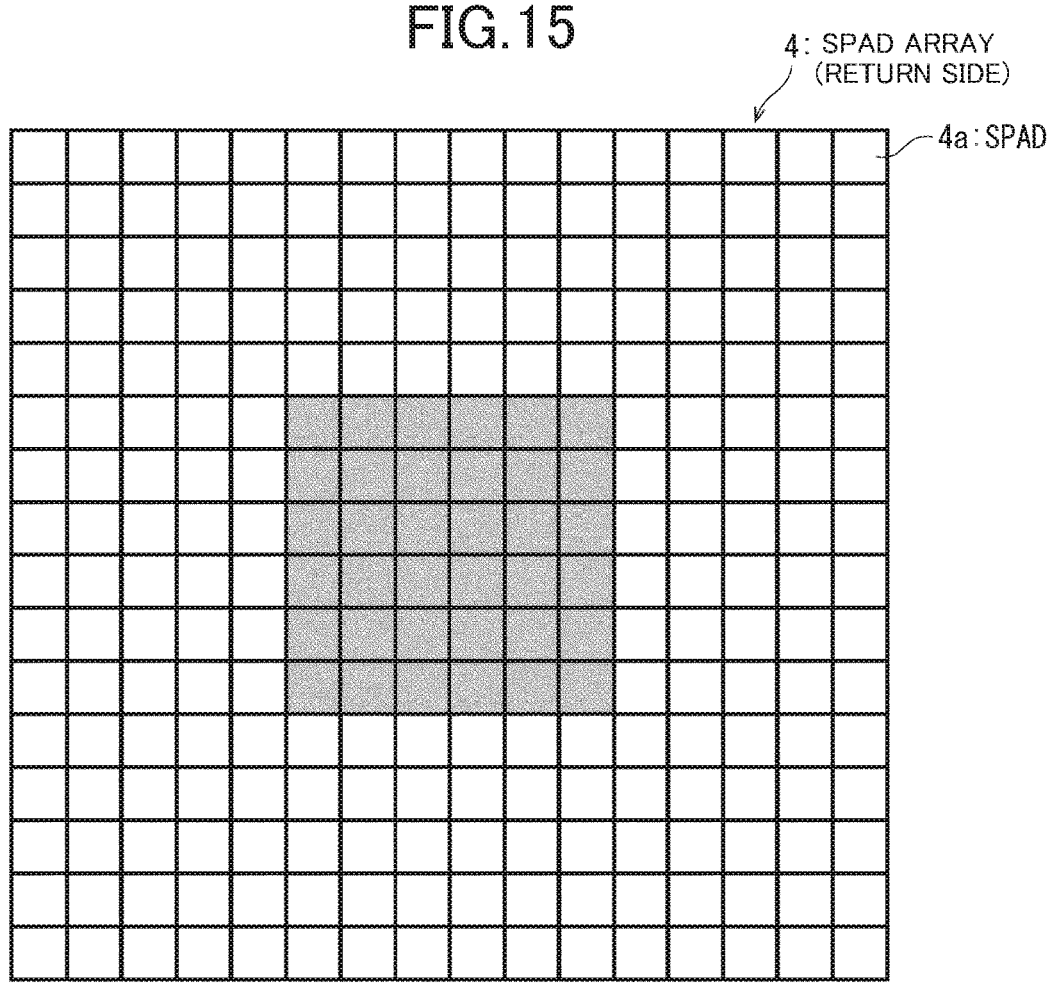
FIG. 15 is a diagram illustrating distribution of pulse count values of pulse signals output from the SPADs in the SPAD array of the ranging sensor according to Embodiment 3 when ambient light is incident.
Figure 16:
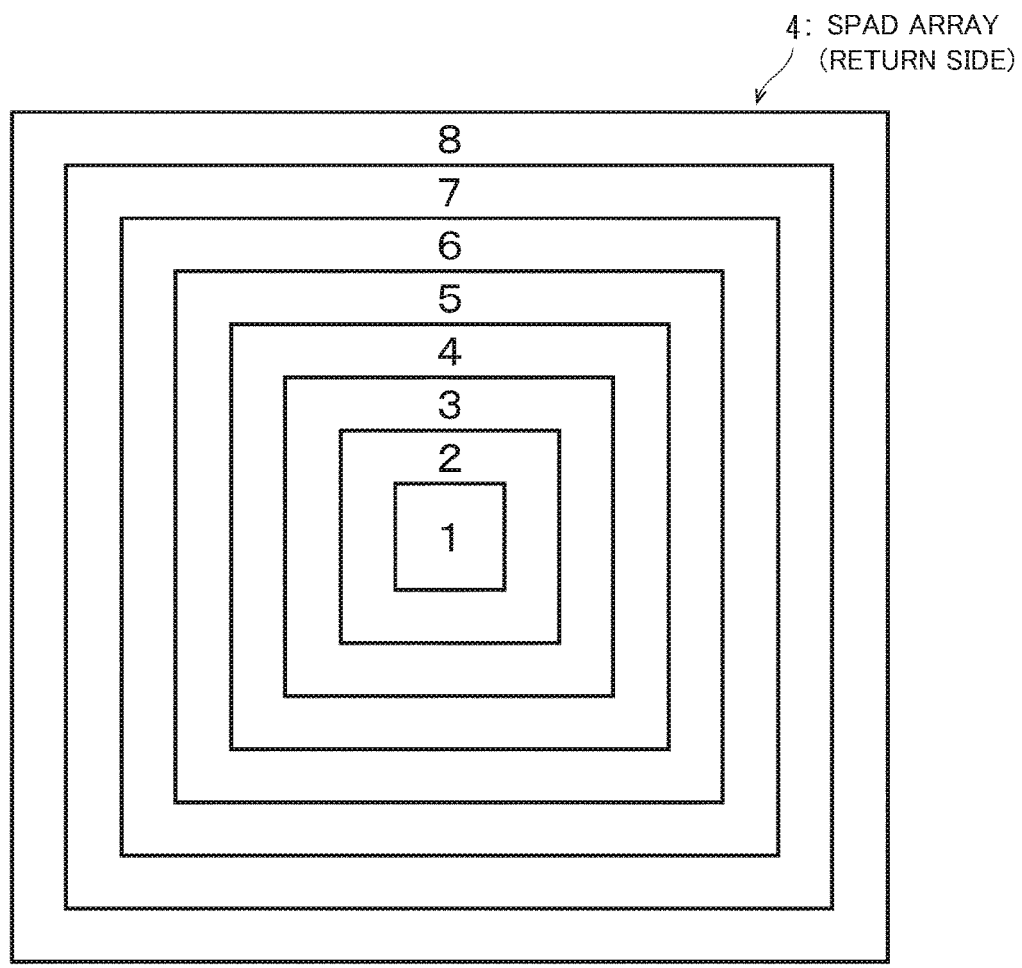
FIG. 16 is a diagram illustrating weighting coefficients corresponding to positions in the SPAD array illustrated in FIG. 15 to determine SPADs for which operation is to be stopped.

FIG. 14 is a diagram illustrating a positional relationship of a ranging sensor 100, detection object 200, and ambient light source, according to the present embodiment. FIG. 15 is a diagram illustrating distribution of pulse count values of pulse signals output from the SPADs 4a in the SPAD array 4 of the ranging sensor 100 when ambient light is incident. FIG. 16 is a diagram illustrating weighting coefficients corresponding to positions on the SPAD array 4, to determine SPADs 4a for which operation is to be stopped.

A case will be described in the present embodiment where the ranging sensor 100, detection object 200, and ambient light source are situated in the positional relationship illustrated in FIG. 14. In this positional relationship, the detection object 200 is situated in front of the ranging sensor 100, and the ambient light source is irradiating the detection object 200 with light from a frontlighting position obliquely behind the ranging sensor 100. Also, the detection object 200 is configured of a material with high reflectance, and the ranging sensor 100 according to the present embodiment generates reflection of ambient light, as illustrated in FIG. 14.

In such a case, the middle portion of the SPAD array 4 may react, to reflecting light from the detection object 200, as illustrated in FIG. 15. Upon detecting that the SPADs 4a at the middle portion are where there is incident ambient light at the SPAD array 4, the ambient-light-incident SPAD determining unit 10 illustrated in FIG. 1 stops these SPADs 4a. Accordingly, a phenomenon may occur of being in a state where distance to the detection object 200 cannot be measured.

In order to avoid such a phenomenon, the SPAD front-end circuit 6 (coefficient multiplying unit) provides the pulse signals of the SPADs 4a with weighting coefficients of 1 through 8, in accordance with the position on the SPAD array 4, as illustrated in FIG. 16. Specifically, the SPAD front-end circuit 6 multiplies the pulse signals of the SPADs 4a by weighting coefficients such that, the value increases from the middle portion of the SPAD array 4 toward the perimeter portion. More specifically, the weighting coefficients are the smallest at the middle portion of the SPAD array 4, largest at the perimeter portion of the SPAD array 4, and increase (in increments of 1, for example) from the middle portion of the SPAD array 4 toward the perimeter portion. Note however, that the weighting coefficients do not have to be values that increase in increments of 1.

The SPAD front-end circuit 6 multiplies the pulse signals of the SPADs 4a output from the SPAD array 4 by the above coefficients. The SPAD front-end circuit 6 has a multiplying circuit for each SPAD 4a for this purpose.

Upon determining that the number of pulses per unit time of the shaped pulse signals output from the SPAD front-end circuit 6 is greater than a predetermined value, the ambient-light-incident SPAD determining unit 10 decides to stop operation of the SPADs 4a corresponding to these shaped pulse signals.

Thus, pulse signals output from the SPADs 4a are multiplied by weighting coefficients dependent on the position on the SPAD array 4. Accordingly, the greater the weighting coefficient by which a pulse signal output by a SPAD 4a is, the higher the probability is that determination will be made that there is incident ambient light. Thus, SPADs 4a stopping due to reflection of ambient light from the detection object 200 can be prevented by reducing the probability that SPADs 4a at the middle portion of the SPAD array 4 will stop, for example.

Embodiment 4

Embodiment 4 of the present invention will be described below with reference to FIG. 1, FIG. 14, and FIG. 17 through FIG. 24. Note that for the sake of convenience in description, components having the same functions as components described in Embodiment 1 are denoted by the same symbols, and description thereof will be omitted.

Figure 17:
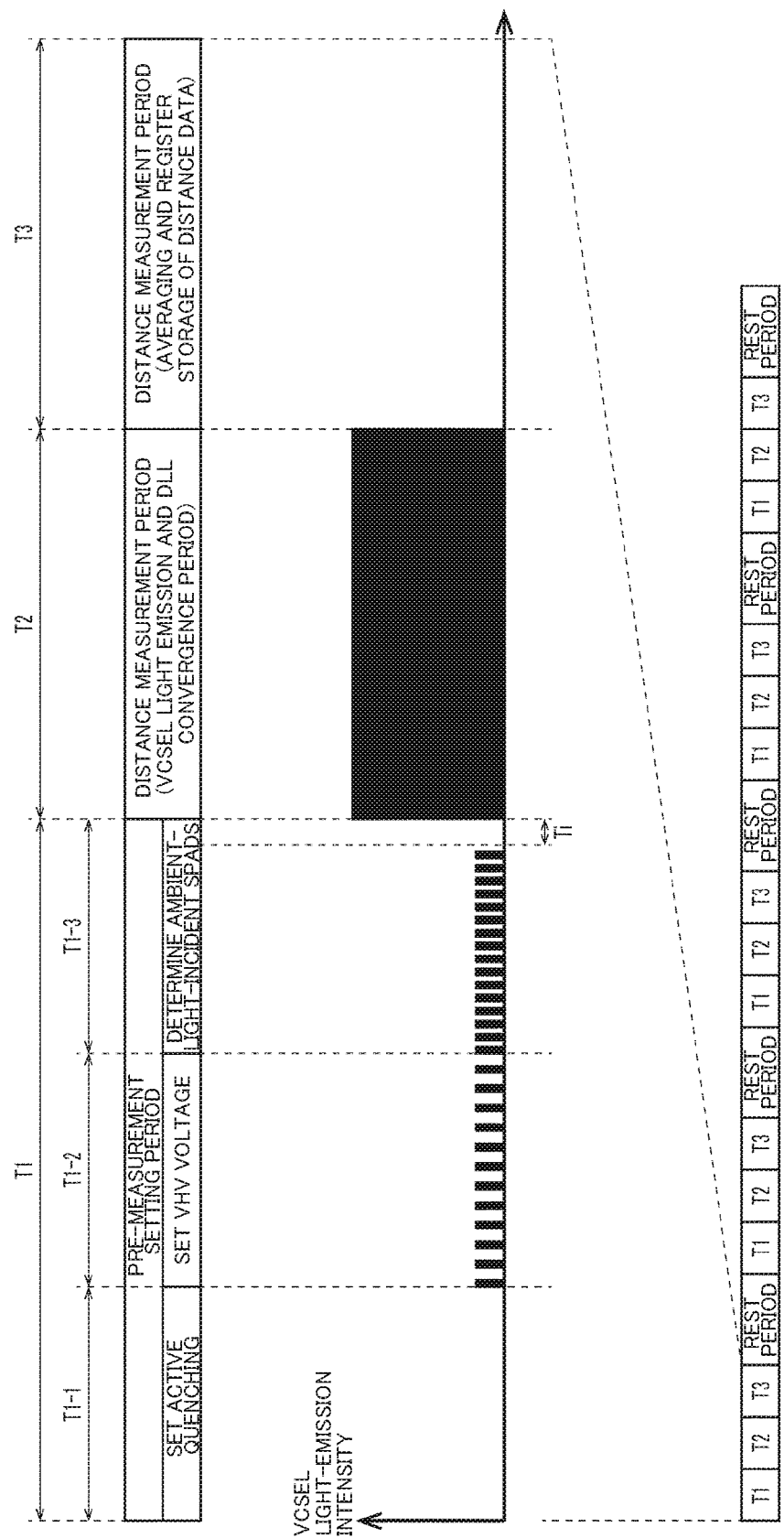
FIG. 17 is a sequence diagram illustrating operations of a ranging sensor according to Embodiment 4 of the present invention.
Figure 18:
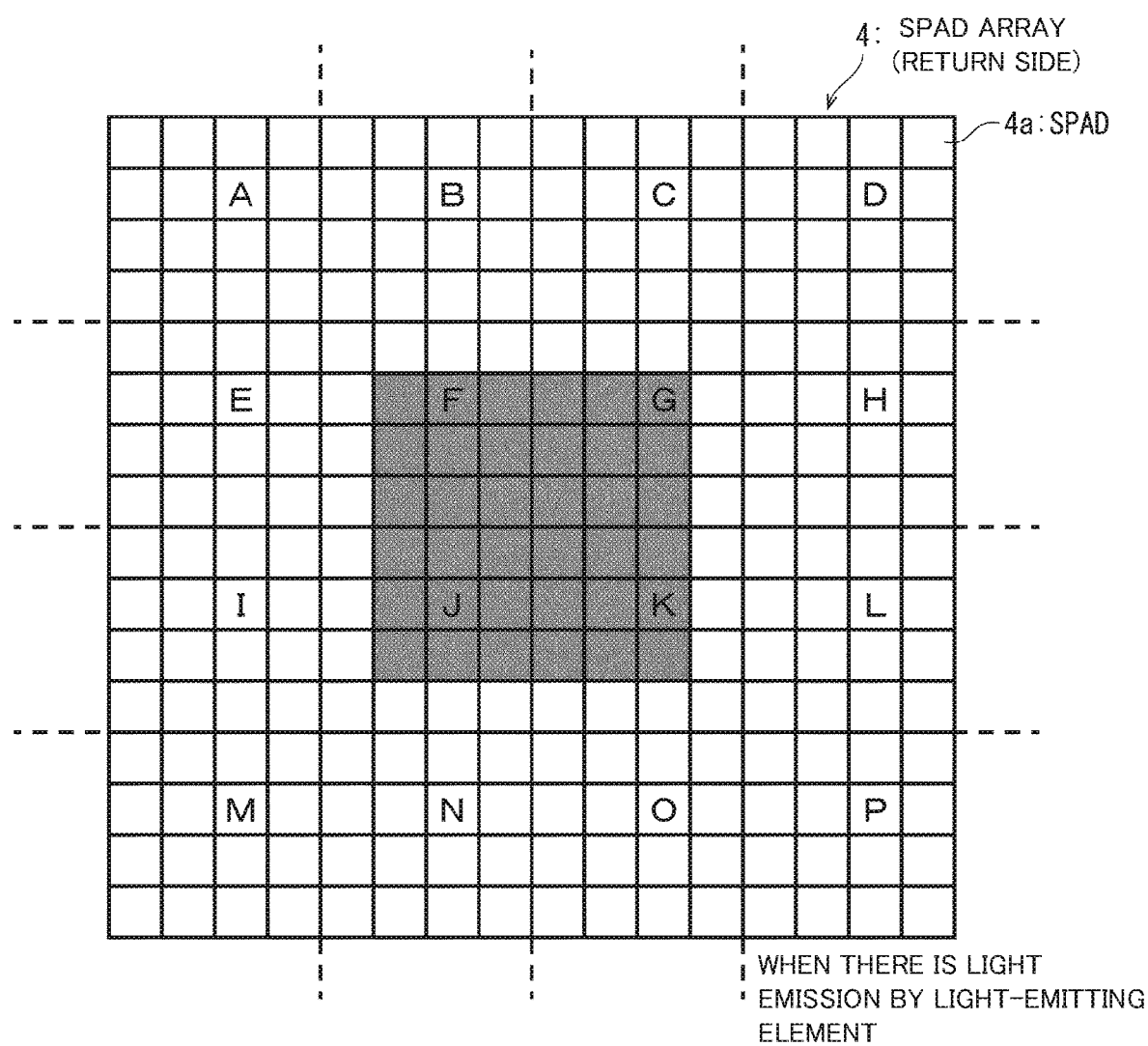
FIG. 18 is a diagram illustrating distribution of pulse count values of pulse signals output from the SPADs in the SPAD array when a light-emitting element is emitting light, in the ranging sensor according to Embodiment 4.
Figure 19:
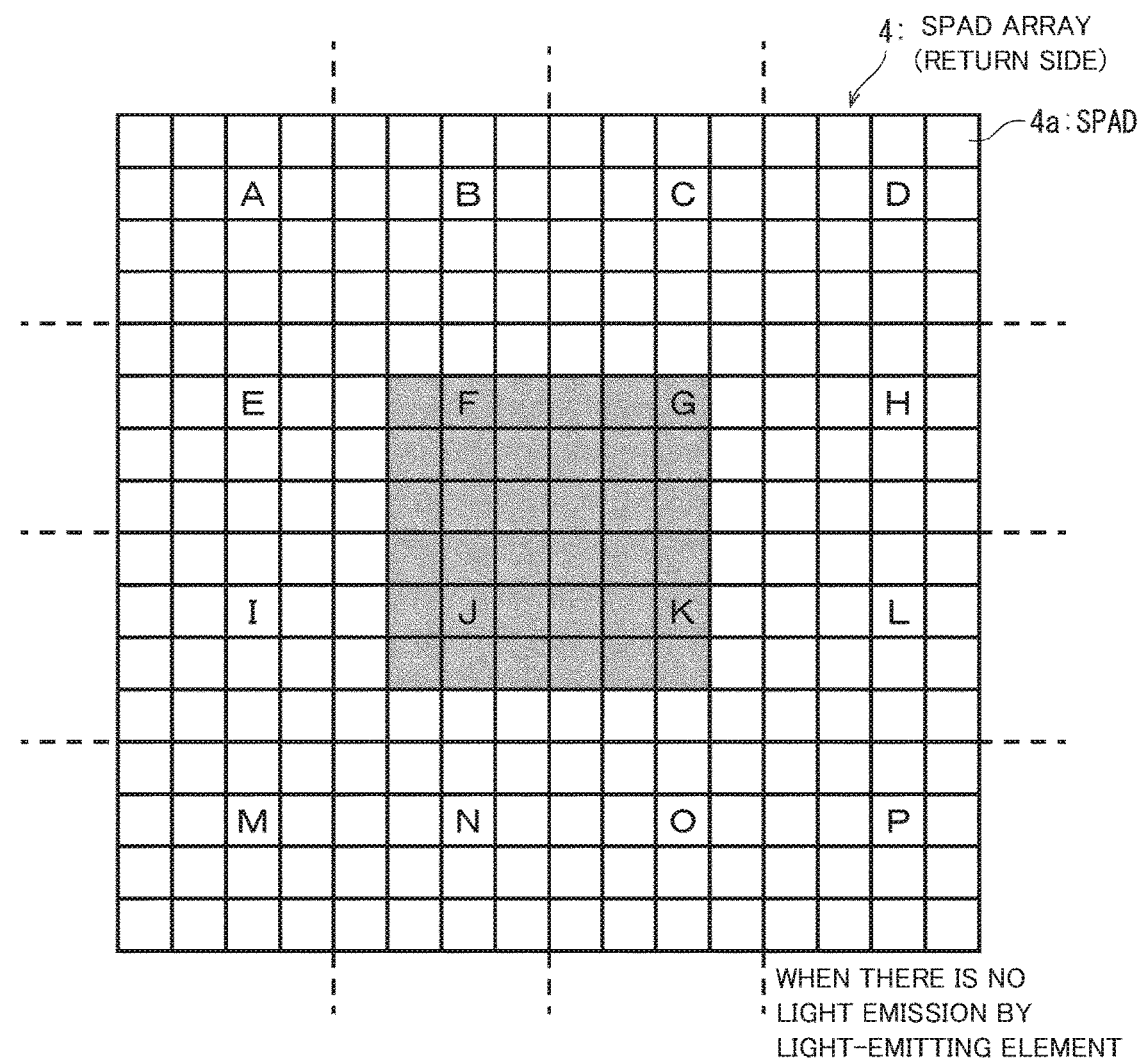
FIG. 19 is a diagram illustrating distribution of pulse count values of pulse signals output from the SPADs in the SPAD array when a light-emitting element is not emitting light, in the ranging sensor according to Embodiment 4.
Figure 20:
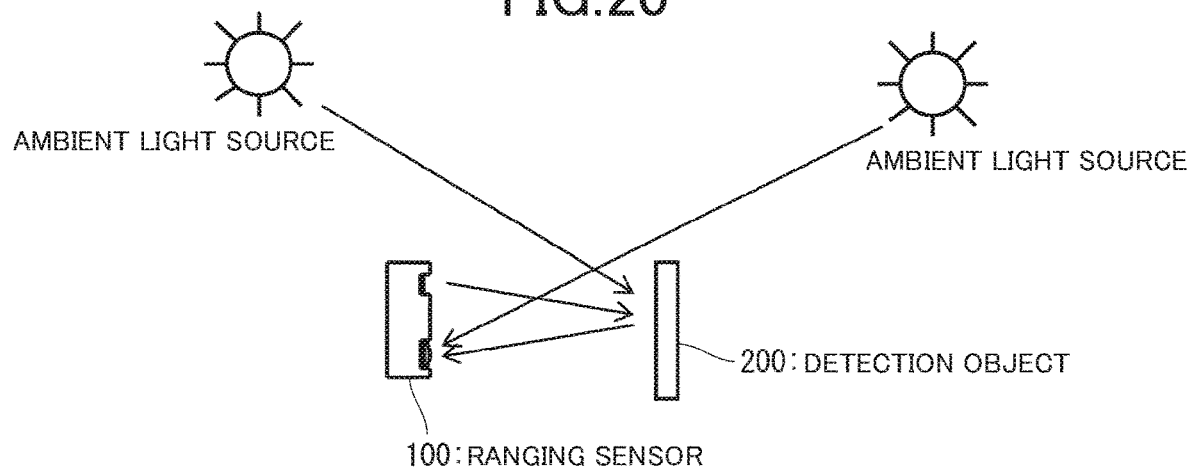
FIG. 20 is a diagram illustrating a positional relationship of the ranging sensor, detection object, and ambient light source, according to Embodiment 4.
Figure 21:
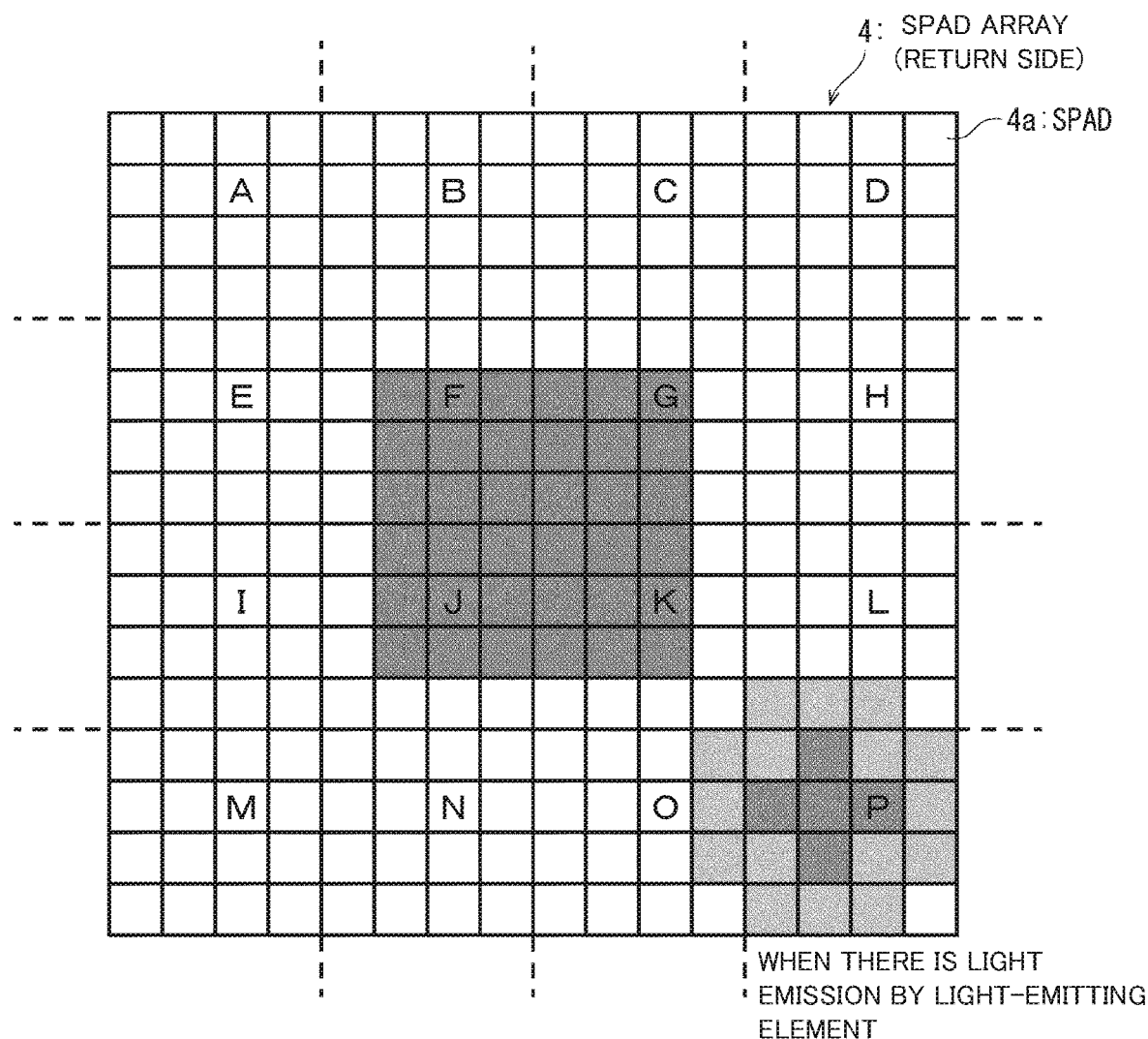
FIG. 21 is a diagram illustrating distribution of pulse count values of pulse signals output from the SPADs in the SPAD array when the light-emitting element is not emitting light under the conditions illustrated in FIG. 11, in the ranging sensor according to Embodiment 4.
Figure 22:
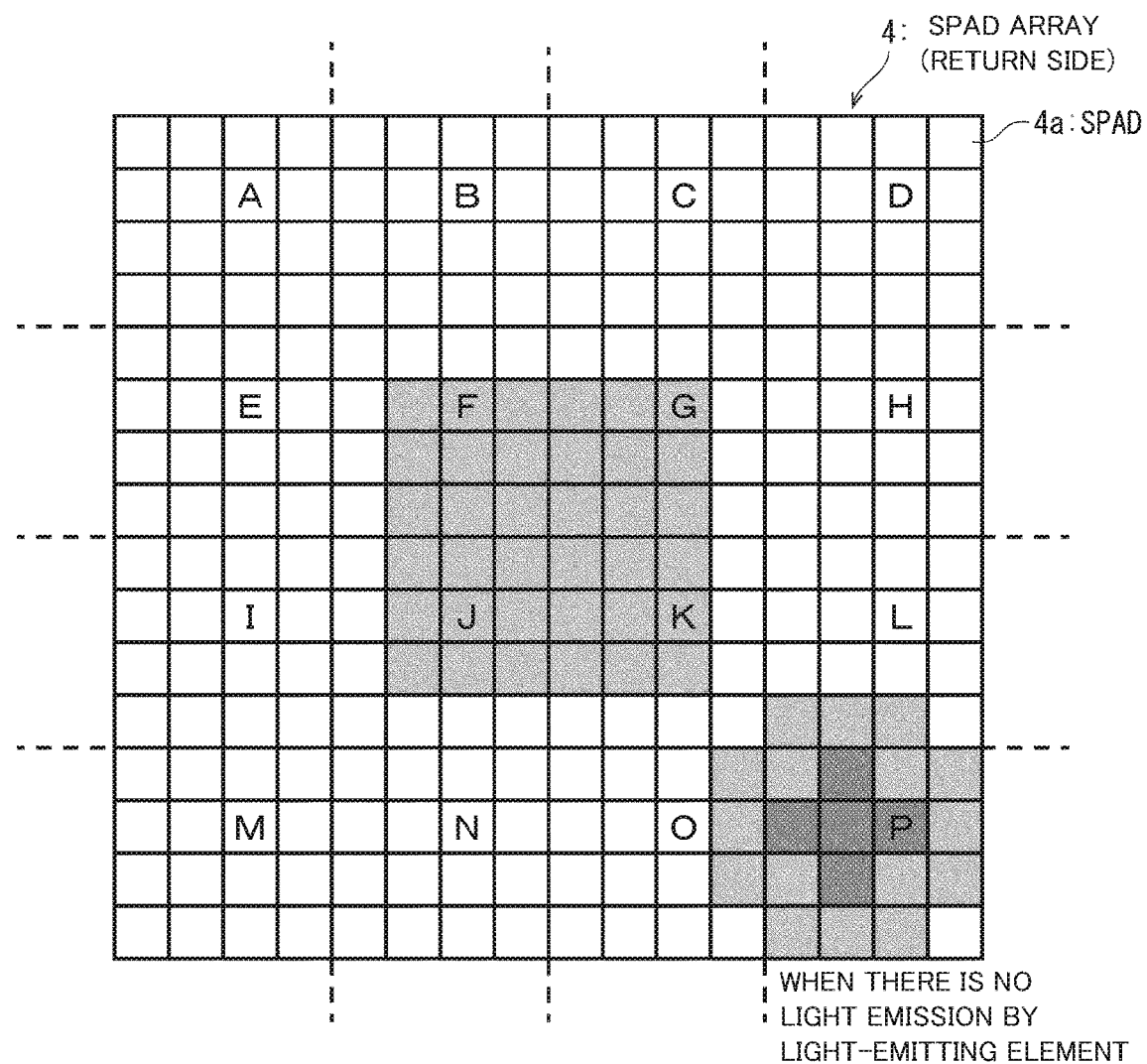
FIG. 22 is a diagram illustrating distribution of pulse count values of pulse signals output from the SPADs in the SPAD array when the light-emitting element is emitting light under the conditions illustrated in FIG. 11, in the ranging sensor according to Embodiment 4.
Figure 23:
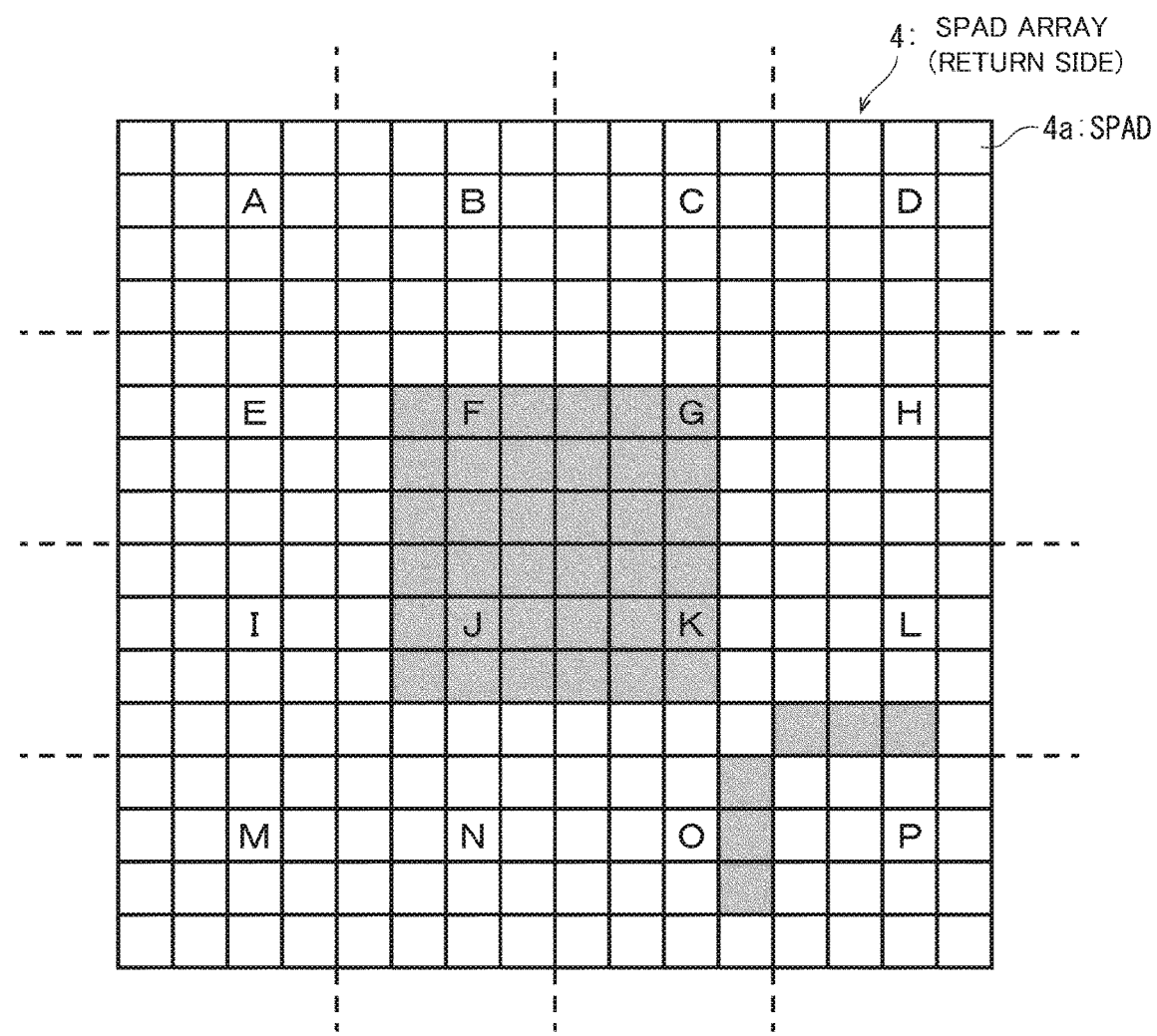
FIG. 23 is a diagram illustrating distribution of pulse count values of pulse signals output from the SPADs in a state where operation of the SPADs where ambient light is incident has been stopped under the conditions illustrated in FIG. 11, in the ranging sensor according to Embodiment 4.
Figure 24:
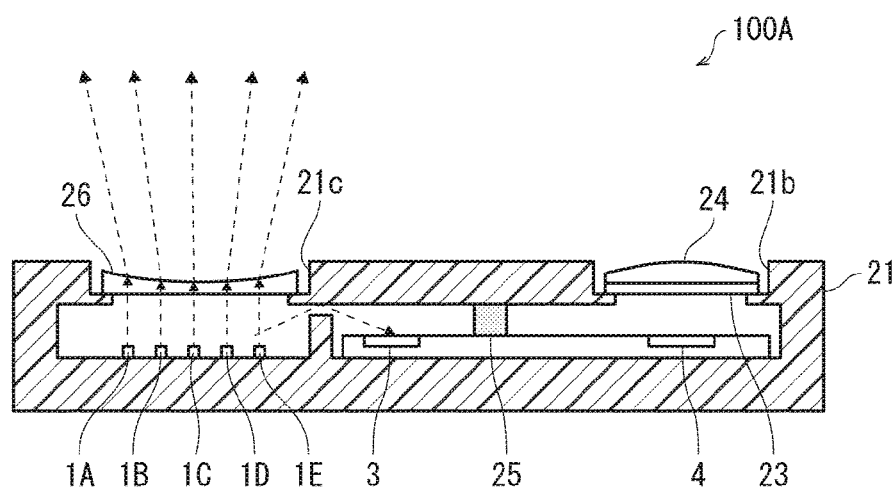
FIG. 24 is a longitudinal-sectional view illustrating the configuration of another ranging sensor according to Embodiment 4.

FIG. 17 is a sequence diagram illustrating operations of a ranging sensor 100 according to the present embodiment. FIG. 18 is a diagram illustrating distribution of pulse count values of pulse signals output from the SPADs 4a in the SPAD array 4 when a VCSEL 1 (light-emitting element) has emitted light. FIG. 19 is a diagram illustrating distribution of pulse count values of pulse signals output from the SPADs 4a in the SPAD array 4 when the VCSEL 1 is not emitting light. FIG. 20 is a diagram illustrating a positional relationship of the ranging sensor 100, detection object 200, and ambient light source. FIG. 21 is a diagram illustrating distribution of pulse count values of pulse signals output from the SPADs 4a in the SPAD array 4 when the VCSEL 1 is not emitting light under the conditions illustrated in FIG. 11. FIG. 22 is a diagram illustrating distribution of pulse count values of pulse signals output from the SPADs 4a in the SPAD array 4 when the VCSEL 1 is emitting light under the conditions illustrated in FIG. 11. FIG. 23 is a diagram illustrating distribution of pulse count values of pulse signals output from the SPADs in a state where operation of the SPADs 4a where ambient light is incident has been stopped under the conditions illustrated in FIG. 11. FIG. 24 is a longitudinal-sectional view illustrating the structure of another ranging sensor 100A according to the present embodiment.

Unlike in Embodiment 1 (see FIG. 4), in the present embodiment the ambient-light-incident SPAD determining unit 10 counts the number of pulses of pulse signals (number of output, pulses) that the SPAD array 4 outputs for when the VCSEL 1 is made to emit light and for when the VCSEL 1 is made to not emit light during the ambient-light-incident SPAD determining period T1-3, as illustrated in FIG. 17. Periods for causing the light-emitting element to emit light and periods for causing the light-emitting element to not emit light are the same. In a case where the SPAD array 4 is divided into 16 regions A through P, 16 light-emitting periods and 16 non-light-emitting periods will be provided.

In a case where the ranging sensor 100 is situated at a positional relationship such as illustrated in FIG. 14, the count value of the number of output pulses of the SPADs 4a is concentrated at the middle portion of the SPAD array 4 when the VCSEL 1 is emitting light, as illustrated in FIG. 18. Also, the count value of the number of output pulses of the SPADs 4a is concentrated at the middle portion of the SPAD array 4 when the VCSEL 1 is not emitting light, as illustrated in FIG. 19.

In a case where the detection object 200 is situated near the ranging sensor 100, light where reflected light of the light of the VCSEL 1 from the detection object 200, and reflected light of ambient light from the detection object 200, have been added, is incident on the SPAD array 4. Accordingly, the number of output pulses of the SPADs 4a when the VCSEL 1 is emitting light is greater than the number of output pulses of the SPADs 4a when the VCSEL 1 is not emitting light.

Accordingly, the ambient-light-incident SPAD determining unit 10 calculates, beforehand, a difference or a ratio of the number of output pulses of the SPADs 4a in the regions A through P on the SPAD array 4 between when the VCSEL 1 is emitting light and when the VCSEL 1 is not emitting light. The ambient-light-incident SPAD determining unit 10 distinguishes whether or not the detection object 200, or an ambient light source at a far distance such as sunlight or the like, from this difference or ratio. In a case where SPADs 4a are generating pulse signals from ambient light alone, the ambient-light-incident SPAD determining unit 10 stops operation of the SPADs 4a in that region. Accordingly, distance to the detection object 200 can be measured with precision while securing the area size of the detecting area.

Further, in a case where the ranging sensor 100 is situated in a positional relationship such as illustrated in FIG. 20, the ranging sensor 100 will be affected by two types of ambient light, frontlighting and backlighting. In this case, light where light from an ambient light source obliquely behind the ranging sensor 100 has reflected by the detection object 200 is incident on the ranging sensor 100, and direct light from an ambient light source obliquely behind the detection object 200 is incident on the ranging sensor 100.

The count values of the number of output pulses of the SPADs 4a of the SPAD array 4 when the VCSEL 1 is made to emit light during the ambient-light-incident SPAD determining period T1-3 illustrated in FIG. 17 have a distribution such as illustrated in FIG. 21. In this case, the SPADs 4a in the regions F, G, J, and K react to both the reflection component where ambient light from the ambient light source obliquely behind the ranging sensor 100 has been reflected by the detection object 200, and the reflection component of light from the VCSEL 1 by the detection object 200, and output pulse signals. The SPADs 4a centered on the region P react to direct light of ambient light from the ambient light source obliquely behind the detection object 200, and output pulse signals.

The count values of the number of output pulses of the SPADs 4a of the SPAD array 4 when the VCSEL 1 is not emitting light have a distribution such as illustrated in FIG. 22. As shown here, the number of output pulses of the SPADs 4a in the regions F, G, J, and K is less in comparison with when the VCSEL 1 is emitting light. This is because the component of light where the light of the VCSEL 1 reflects at the detection object 200 and is incident on the SPADs 4a is reduced as compared to a case where the VCSEL 1 is emitting light (see FIG. 21). The number of output pulses of the SPADs 4a due to ambient light from obliquely behind the ranging sensor 100 is approximately the same during a period where the VCSEL 1 is emitting light and a period of not emitting light, so the difference is small.

Accordingly, in the state illustrated in FIG. 21, and the state illustrated in FIG. 22, the ambient-light-incident SPAD determining unit 10 outputs SPAD selection signals to stop operation of SPADs 4a that satisfy both the following first condition and second condition.

First condition: that the number of output pulses of the SPAD 4a is greater than a predetermined value (first predetermined value)

Second condition: that the difference or ratio between the numbers of output pulses of the SPAD 4a when the VCSEL 1 is emitting light and not emitting light is smaller than a predetermined value (second predetermined value)

When the ambient-light-incident SPAD determining unit 10 stops operation of the SPADs 4a that satisfy the above first condition and second condition, the number of output pulses of the SPADs 4a has a distribution such as illustrated in FIG. 23. Accordingly, operation of the SPADs 4a in the region P is stopped. Direct light of ambient light from obliquely behind the detection object 200 is being imaged at the region P, so the SPADs 4a are made to not react to this direct light. Thus, the effects of ambient light being directly incident on the SPAD array 4 can be suppressed to a minimum, and ranging with high precision is enabled.

Now, in a case where the difference or ratio between the numbers of output pulses of each of the SPADs 4a when the VCSEL 1 is emitting light and not emitting light in the ambient-light-incident SPAD determining period T1-3 described above is great (greater than the predetermined value), this means that the detection object 200 is near to the ranging sensor 100. In this case, the ambient-light-incident SPAD determining unit 10 makes the relevant SPADs 4a non-operational, and also the SPAD bias control unit 12 (light-emission intensity control unit) reduces the light-emission intensity of the VCSEL 1 (reduces the amount of light emission) during the distance measurement period T2 illustrated in FIG. 17, whereby electric current consumption can be suppressed.

Alternatively, in a case of using a ranging sensor 100A illustrated in FIG. 24 instead of the ranging sensor 100 illustrated in FIG. 2, electric current consumption can be suppressed as follows. The ranging sensor 100A illustrated in FIG. 24 has five VCSELs 1A through 1E as light-emitting elements, and also has a diffusion lens 26 instead of the optical filter 22, in comparison with the ranging sensor 100 illustrated in FIG. 2. In the ranging sensor 100A configured in this way, the SPAR bias control unit 12 (light emission angle control unit) causes non-emission in sequential order such as VCSEL 1B, VCSEL 1C, and VCSEL 1D, out of the VCSELs 1A through 1E that are emitting light, thereby reducing the number of light-emitting elements emitting light, and controlling the light emission angle. Accordingly, electric current consumption can be suppressed.

Embodiment 5

Embodiment 5 of the present invention will be described below with reference to FIG. 25. Mote that for the sake of convenience in description, components having the same functions as components described in Embodiments 1 to 4 are denoted by the same symbols, and description thereof will be omitted.

Figure 25:
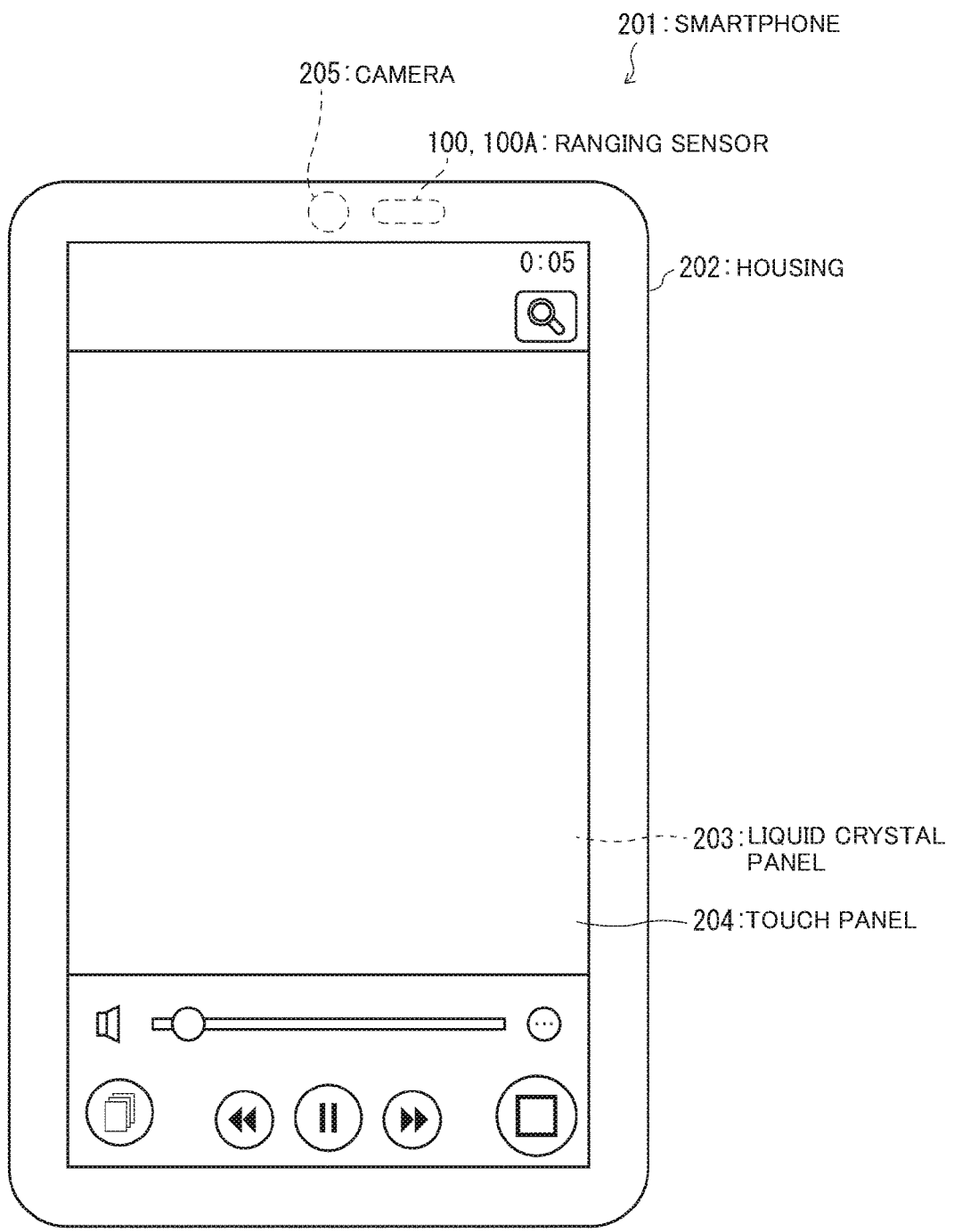
FIG. 25 is a plan view illustrating the configuration of a smartphone according to Embodiment 5 of the present invention.
Figure 26:
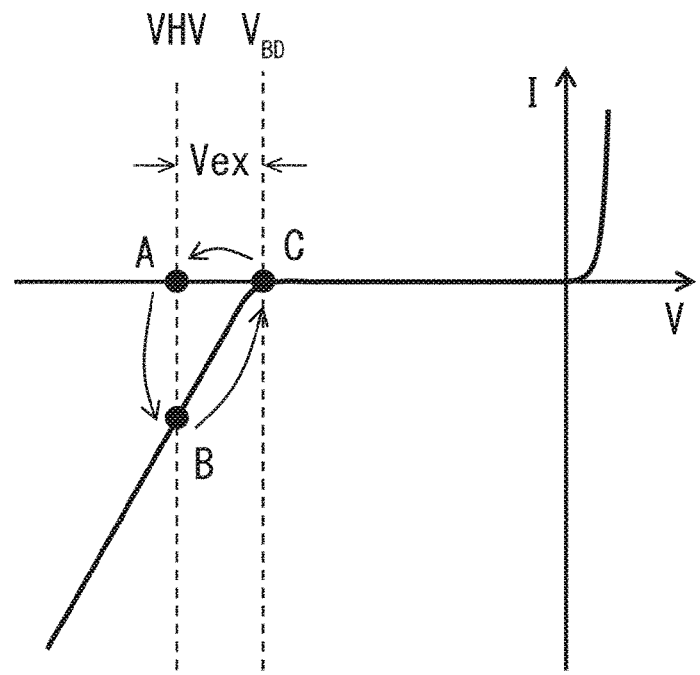
FIG. 26 is a diagram illustrating operating states of a SPAD in Geiger mode.
Figure 27:
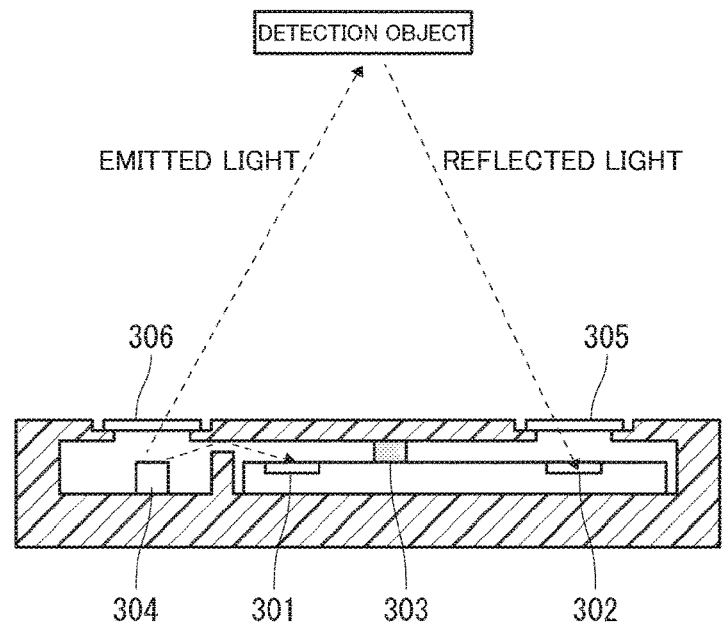
FIG. 27 is a longitudinal-sectional view illustrating configuration of a conventional TOF-type ranging sensor.
Figure 28:
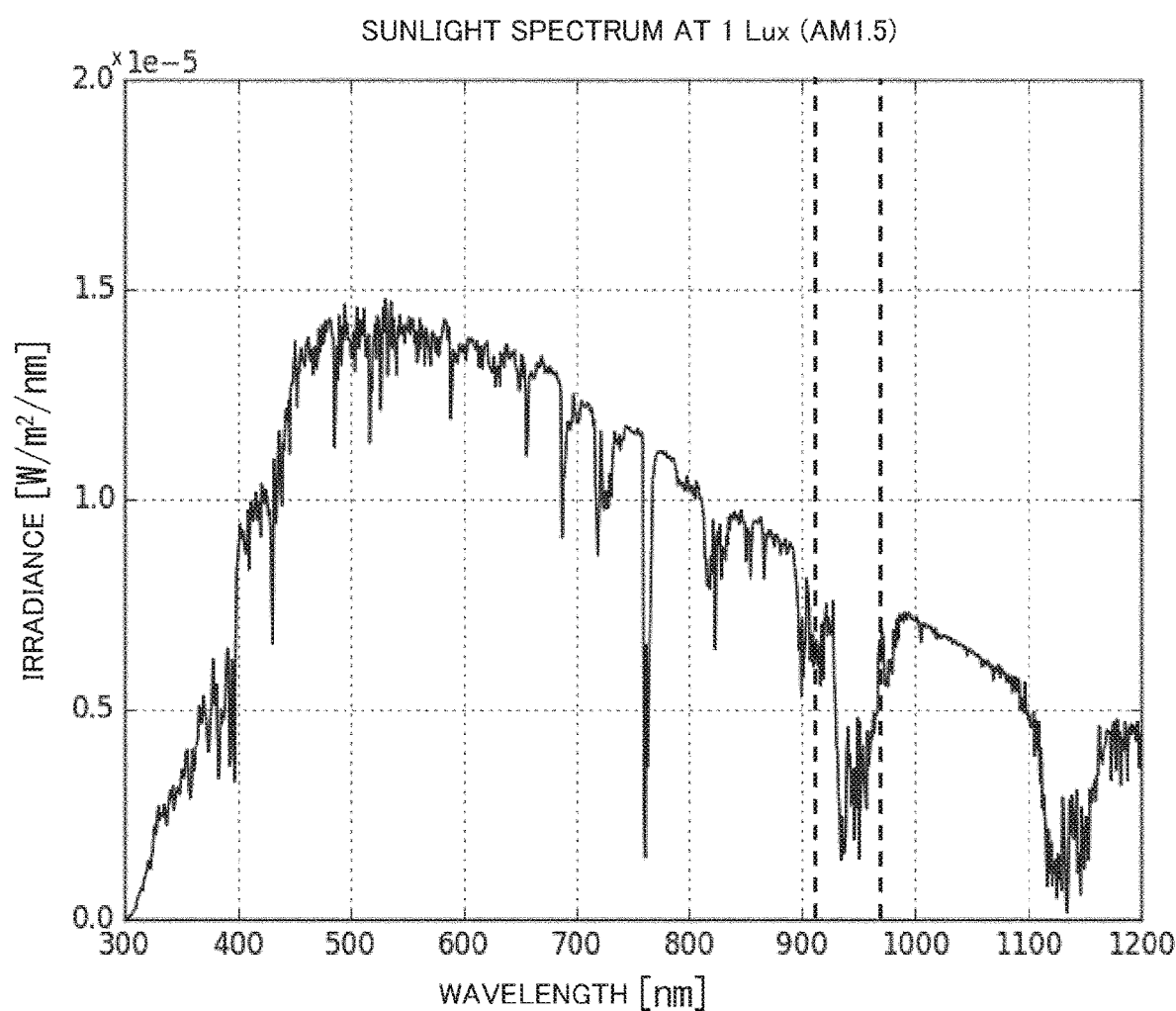
FIG. 28 is a spectrum diagram of sunlight (AM1.5) at 1 lux.
Figure 29:
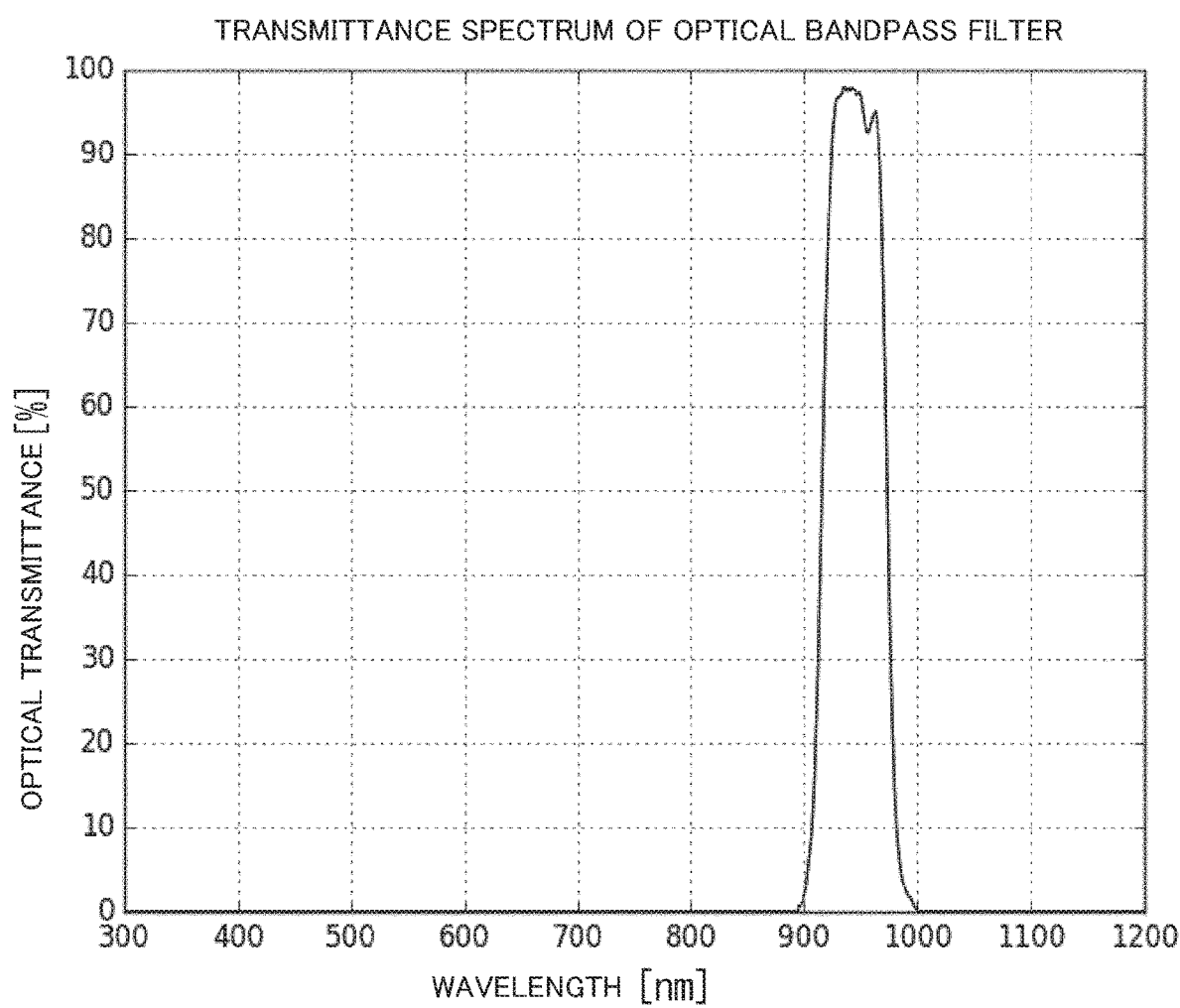
FIG. 29 is a diagram illustrating transmission spectral properties of an optical bandpass filter.
Figure 30:
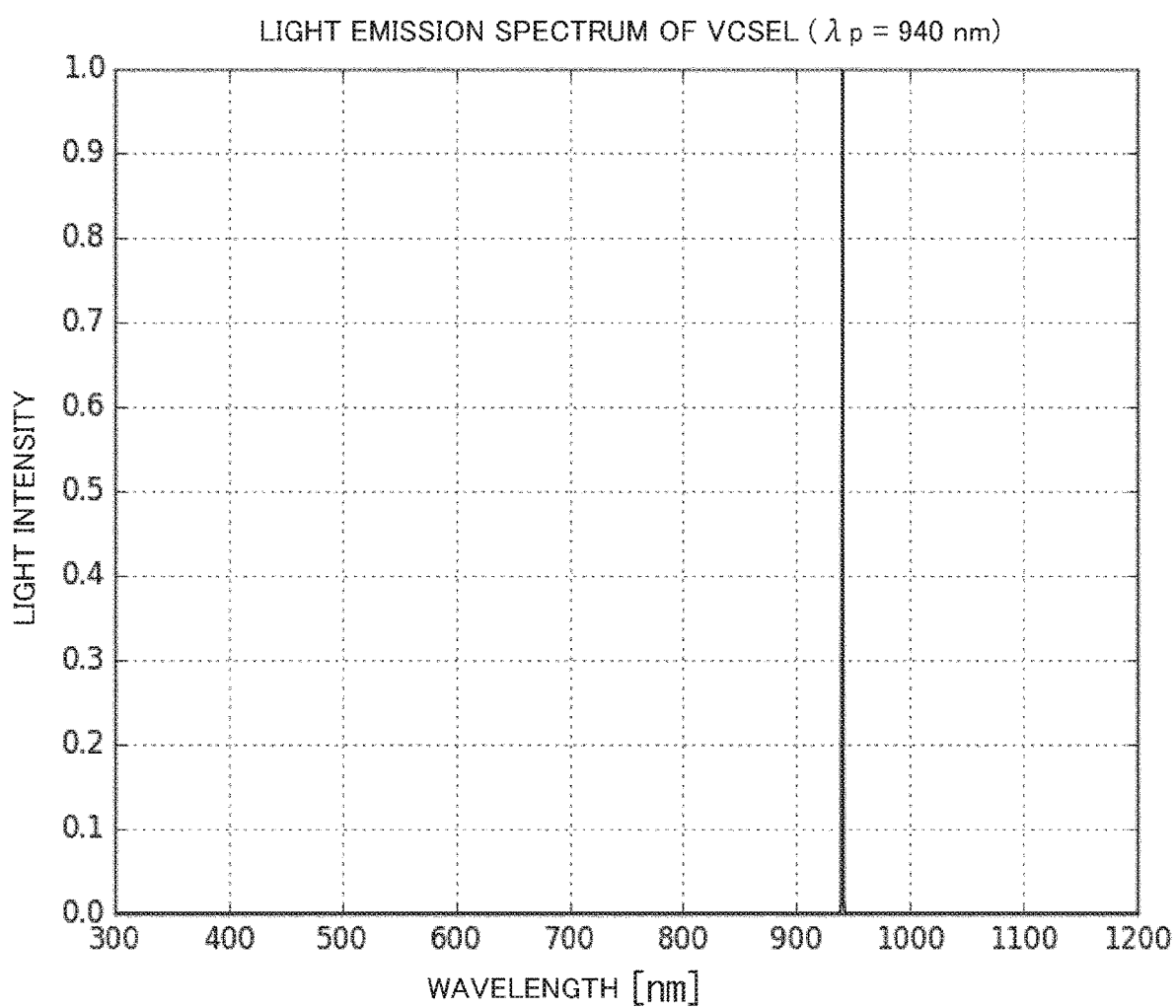
FIG. 30 is a diagram illustrating a light emission spectrum of a light-emitting element (VCSEL).

FIG. 25 is a plan view illustrating the configuration of a smartphone 201 according to the present embodiment.

The smartphone 201 serving as portable electronic equipment is configured with a liquid crystal panel 203 and a touch panel 204 having been assembled into a housing 202, as illustrated in FIG. 25. The liquid crystal panel 203 is provided on an operating face side of the housing 202 in this smartphone 201. Also, the touch panel 204 is provided upon the liquid crystal panel 203.

A camera 205 and the ranging sensor 100 (see FIG. 2) or the ranging sensor 100A (see FIG. 24) are disposed on the upper portion of the housing 202, on a rear face at the opposite side from the operating face. The camera 205 is provided for shooting still images or moving images.

The ranging sensors 100 and 100A are light-receiving/emitting units provided to measure the distance to a detection object 200 that is a subject of shooting by the camera 205.

The smartphone 201 is provided with the ranging sensor 100 or 100A as described above, so even when using in an environment where there is occurrence of ambient light, effects of ambient light on the detection object 200 are suppressed, and the distance to the detection object 200 can be accurately measured.

SUMMARIZATION

A photodetector according to a first form of the present invention includes a light-emitting element (VCSEL 1), a first light-receiving unit (SPAD array 3) that has multiple avalanche photodiodes (SPADs 3a) as a first light-receiving element that detects, in Geiger mode, photons of pulse light emitted by the light-emitting element, a second light-receiving unit (SPAD array 4) that has multiple avalanche photodiodes (SPADs 4a) as a second light-receiving element that detects, in Geiger mode, photons of reflected light where the pulse light has been reflected by a detection object 200, a time difference measuring unit (DLL 7) that measures a time difference between a pulse signal output from the first light-receiving element of the first light-receiving unit and a pulse signal output from the second light-receiving element of the second light-receiving unit, an ambient-light-incident light-receiving-element determining unit (ambient-light-incident SPAD determining unit 10) that determines the second light-receiving element on which ambient light is incident, based on pulse signals output from second light-receiving elements of the second light-receiving unit when the Light-emitting element is not emitting light, and an operation stopping unit (SPAD front-end circuit 6) that stops operation of the second light-receiving elements for which determination is made that ambient light is incident.

According to the above configuration, operation of a second light-receiving element, for which determination is made that ambient light is incident, is stopped. Accordingly, even if ambient light is incident on the second light-receiving element, a pulse signal is not output from this second light-receiving element. Thus, effects of ambient light are suppressed, and distance to the detection object can be measured in a precise manner.

In a photodetector according to a second form of the present invention, in the first form, in a case where a number of pulses per unit time of a pulse signal output from the second light-receiving element is greater than a predetermined value, the ambient-light-incident light-receiving-element determining unit may determine that ambient light is incident on the second light-receiving element that has output the pulse signal.

According to the above configuration, sensitivity of suppressing ambient light can be adjusted by appropriately setting the predetermined value in accordance with the light amount of ambient light.

In a photodetector according to a third form of the present invention, the first form may further include a coefficient multiplying unit (SPAD front-end circuit 6) that multiplies a pulse signal of the second light-receiving element by a weighting coefficient corresponding to a position of the second light-receiving element in the second light-receiving unit. In a case where a number of pulses per unit time of the pulse signal multiplied by the weighting coefficient is greater than a predetermined value, the ambient-light-incident light-receiving-element determining unit may determine that ambient light is incident on the second light-receiving element that has output the pulse signal.

According to the above configuration, the greater the weighting coefficient by which a pulse signal output by a second light-receiving element has been multiplied is, the higher the probability is that determination will be made that there is incident ambient light. Thus, precision of determining the second light-receiving element where ambient light is incident can be improved by multiplying the pulse signal of the second light-receiving element in a region that has a high probability of incident ambient light at the second light-receiving unit, by large weighting coefficients.

In a photodetector according to a fourth form of the present invention, in the third form, the weighting coefficient may be smallest at a middle portion of the second light-receiving unit, and become larger in a direction from the middle portion toward a perimeter portion of the second light-receiving unit.

According to the above configurations, second light-receiving elements at the middle portion and near the middle portion of the second light-receiving unit, where there is a high probability of receiving reflected light from a detection object, have a small weighting coefficient multiplied on the pulse signal thereof. Accordingly, the probability of determining ambient light is incident on these second light-receiving elements can be reduced. Accordingly, even if the second light-receiving unit receives light where ambient light incident to a detection object from obliquely behind the second light-receiving unit situated in front of the detection object is reflected by the detection object for example, operation of the second light-receiving element at the middle portion of the second light-receiving unit can be kept from stopping. Accordingly, a situation where distance cannot be measured can be suppressed.

In a photodetector according to a fifth form of the present invention, in the first form, in a case where a number of pulses of a pulse signal output from the second light-receiving element is greater than a first predetermined value, and a difference or a ratio between the numbers of pulses when the light-emitting element is emitting light and not emitting light is smaller than a second predetermined value, determination may be made that ambient light is incident on the second light-receiving element outputting the pulse signal.

According to the above configuration, operation of the second light-receiving element near the perimeter portion of the second light-receiving unit where ambient light from obliquely behind the detection object is incident can be stopped. Thus, precision of distance measurement can be improved.

In a photodetector according to a sixth form of the present invention, the fifth form may further include a light-emission intensity control unit that reduces light-emission intensity of the light-emitting element in a case where the difference or the ratio between the numbers of pulses when the light-emitting element is emitting light and not emitting light is greater than a predetermined value.

According to the above configuration, the light-emission intensity of the light-emitting element can be reduced when a detection object is near the second light-receiving unit, thereby suppressing electric current consumption.

In a photodetector according to a seventh form of the present invention, the fifth form may further include a light emission angle control unit that controls a light emission angle of the light-emitting element in a case where the difference or the ratio between the numbers of pulses when the light-emitting element is emitting light and not emitting light is greater than a predetermined value.

According to the above configuration, the light emission angle of the light-emitting element can be reduced when a detection object is near the second light-receiving unit, thereby suppressing electric current consumption.

In a photodetector according to an eighth form of the present invention, any one of the first through seventh forms may further include a concentrating lens disposed on a side of the second light-receiving unit on which light is incident.

According to the above configuration, the imaging position on the second light-receiving unit can be changed by the concentrating lens, in accordance with the position of the detection object.

Portable electronic equipment according to a ninth form of the present invention includes the photodetector according to any one of the first through eighth forms.

[Additional Items]

The present invention is not restricted to the above-described embodiments. Various types of modifications can be made within the scope set forth in the Claims, and embodiments acquired by appropriately combining technical means disclosed in each of different embodiments also are included in the technical scope of the present invention. Further, new technical features can be formed by combining technical means disclosed in each of the embodiments.

REFERENCE SIGNS LIST

1 VCSEL (light-emitting element)
3 SPAD array (first light-receiving unit)
3a SPADs (first light-receiving elements)
4 SPAD array (second light-receiving unit)
4a SPADs (second light-receiving elements)
6 SPAD front-end circuit (operation stopping unit, coefficient multiplying unit)
7 DLL
10 ambient-light-incident SPAD determining unit (ambient-light-incident light-receiving-element determining unit)
12 SPAD bias control unit (light-emission intensity control unit, light emission angle control unit)
24 concentrating lens
100, 100A ranging sensor (photodetector)
200 detection object
201 smartphone (portable electronic equipment)

The invention claimed is:

1. A photodetector, comprising:
a light-emitting element;
a first light-receiving unit that has a plurality of avalanche photodiodes as a first light-receiving element that detects, in Geiger mode, photons of pulse light emitted by the light-emitting element;
a second light-receiving unit that has a plurality of avalanche photodiodes as a second light-receiving element that detects, in Geiger mode, photons of reflected light where the pulse light has been reflected by a detection object;
a time difference measuring unit that measures a time difference between a puke signal output from the first light-receiving element of the first light-receiving unit and a pulse signal output from the second light-receiving element of the second light-receiving unit;
an ambient-light-incident light-receiving-element determining unit that determines the second light-receiving element on which ambient light is incident, based on pulse signals output from second light-receiving elements of the second light-receiving unit when the light-emitting element is not emitting light; and
an operation stopping unit that stops operation of the second light-receiving elements for which determination is made that ambient light is incident.

2. The photodetector according to claim 1, wherein, in a case where a number of pulses per unit time of a pulse signal output from the second light-receiving element is greater than a predetermined value, the ambient-light-incident light-receiving-element determining unit determines that ambient light is incident on the second light-receiving element that has output the pulse signal.

3. The photodetector according to claim 1, further comprising:
a coefficient multiplying unit that multiplies a pulse signal of the second light-receiving element by a weighting coefficient corresponding to a position of the second light-receiving element, in the second light-receiving unit,
wherein, in a case where a number of pulses per unit time of the pulse signal multiplied by the weighting coefficient is greater than a predetermined value, the ambient-light-incident light-receiving-element determining unit determines that ambient light is incident on the second light-receiving element that has output the pulse signal.

4. The photodetector according to claim 3, wherein the weighting coefficient is smallest at a middle portion of the second light-receiving unit and becomes larger in a direction from the middle portion toward a perimeter portion of the second light-receiving unit.

5. The photodetector according to claim 1, wherein, in a case where a number of pulses of a pulse signal output from the second light-receiving element is greater than a first predetermined value, and a difference or a ratio between the numbers of pulses when the light-emitting element is emitting light and not emitting light is smaller than a second predetermined value, determination is made that ambient light is incident on the second light-receiving element outputting the pulse signal.

6. The photodetector according to claim 5, further comprising:
a light-emission intensity control unit that reduces light-emission intensity of the light-emitting element in a case where the difference or the ratio between the numbers of pulses when the light-emitting element is emitting light and not emitting light is greater than a predetermined value.

7. The photodetector according to claim 5, further comprising:
a light emission angle control unit that controls a light emission angle of the light-emitting element in a case where the difference or the ratio between the numbers of pulses when the light-emitting element is emitting light and not emitting light is greater than a predetermined value.

8. The photodetector according to claim 1, further comprising:
a concentrating lens disposed on a side of the second light-receiving unit on which light is incident.

9. Portable electronic equipment, comprising: the photodetector according to claim 1.

* * * * *